(12) United States Patent
Miura et al.

(10) Patent No.: US 8,350,301 B2
(45) Date of Patent: Jan. 8, 2013

(54) SEMICONDUCTOR PHOTODIODE DEVICE AND MANUFACTURING METHOD THEREOF

(75) Inventors: Makoto Miura, Tsukuba (JP); Shinichi Saito, Kawasaki (JP); Youngkun Lee, Hachioji (JP); Katsuya Oda, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 173 days.

(21) Appl. No.: 12/838,444

(22) Filed: Jul. 17, 2010

(65) Prior Publication Data

US 2011/0031578 A1 Feb. 10, 2011

(30) Foreign Application Priority Data

Aug. 7, 2009 (JP) .................................. 2009-184003

(51) Int. Cl.
*H01L 21/00* (2006.01)

(52) U.S. Cl. ......... 257/233; 257/292; 257/462; 438/328

(58) Field of Classification Search .................. 257/233, 257/292, 462; 438/328
See application file for complete search history.

(56) References Cited

U.S. PATENT DOCUMENTS

| 5,686,734 | A | * | 11/1997 | Hamakawa et al. | ............ | 257/16 |
| 5,962,880 | A | * | 10/1999 | Oda et al. | ....................... | 257/198 |
| 7,638,842 | B2 | * | 12/2009 | Currie et al. | .................. | 257/347 |
| 8,030,728 | B2 | * | 10/2011 | Iwai et al. | ..................... | 257/459 |

FOREIGN PATENT DOCUMENTS

| JP | 57-207383 A | 12/1982 |
| JP | 2007-527626 T | 9/2007 |
| WO | WO 2005/083750 A2 | 9/2005 |

* cited by examiner

*Primary Examiner* — Jarrett Stark
*Assistant Examiner* — Nicholas Tobergte
(74) *Attorney, Agent, or Firm* — Miles and Stockbridge P.C.

(57) ABSTRACT

A semiconductor photodiode includes a semiconductor substrate; a first conduction type first semiconductor layer formed above the semiconductor substrate; a high resistance second semiconductor layer formed above the first semiconductor layer; a first conduction type third semiconductor layer formed above the second semiconductor layer; and a second conduction type fourth semiconductor layer buried in the second semiconductor layer, in which the fourth semiconductor layer is separated at a predetermined distance in a direction horizontal to the surface of the semiconductor substrate.

12 Claims, 49 Drawing Sheets

US 8,350,301 B2

SEMICONDUCTOR PHOTODIODE DEVICE AND MANUFACTURING METHOD THEREOF

CLAIM OF PRIORITY

The present application claims priority from Japanese patent application JP 2009-184003 filed on Aug. 7, 2009, the content of which is hereby incorporated by reference into this application.

FIELD OF THE INVENTION

The present invention relates to a semiconductor photodiode device which is a photodiode device using a germanium containing semiconductor and a manufacturing method thereof, and it particularly relates to a semiconductor photodiode device such as a germanium-phototransistor having a high sensitivity and a high speed performance, as well as a manufacturing method thereof.

BACKGROUND OF THE INVENTION

In existent semiconductor photodiode devices, there has been a technique for overcoming a trade-off relation of the thickness and the inter-p/n electrode distance required for the photoreceiving portion thereby attaining both high speed performance and high efficiency performance (for example, refer to JP-T-2007-527626).

Further, in existent bipolar phototransistors having a photoreceiving portion and an amplification portion together, a bipolar transistor in which the width of the depletion layer in collector/base is made different between the photoreceiving portion and the amplification portion has been known for compatibilizing the high speed performance and the photoreceiving efficiency of the transistor (for example, refer to JP-A-Sho57(1982)-207383).

SUMMARY OF THE INVENTION

Optical communication has become predominant in broad band networks of internets that form a part of the foundation of modern information society. In the optical communication system, near infrared (IR) light in a range of 800 nm to 1600 nm is used. A particularly important wavelength band is a band where loss of optical fibers is minimized, and 850 nm is used for short distant communication and 1310 nm and 1550 nm are used for long distance communication. For photodiodes in the optical communication, compound semiconductors, mainly, gallium arsenide (GaAs) and indium phosphide (InP) having good light absorption characteristics in the long wavelength band have been used. However, for further popularization of future optical communication systems, it is essential to reduce the cost and the size and, further, improve the performance of apparatus, and technical innovation is demanded also for the photodiodes in order to attain such demands.

In view of the background described above, a photodiode using germanium (Ge) is noteworthy. Ge belongs to the same IV group semiconductor as silicon (Si) which is an essential material for modern integrated circuits having a matching property with matured silicon processes and, in addition, has a bandgap at a room temperature of 0.6 eV which is smaller than 1.1 eV of that of Si, and can absorb light up to 1600 nm. Accordingly, Ge is a material that can provide a possibility for fusion of optical devices and electronic devices.

For photodiodes in the optical communication, compatibility is required between the high speed performance conforming to modulation signals at high speed and high efficiency performance of converting more optical signals into electric signals, and research and development have been progressed also for Ge photodiodes with an identical point of view. In the wavelength band of 1550 nm used for long distance communication, an absorption length defined by a distance till the amount of absorbed light is attenuated to 1/e is about 2 µm in a case of Ge and a sufficient thickness is required for the photoreceiving portion. However, since the high speed performance depends on the inter-electrode distance of the photodiode, the high speed performance is degraded more as the distance between p/n electrodes is increased. Therefore, for attaining the high speed performance and the high efficiency performance together, a technical break through for overcoming the trade-off relation has been required. One of means for solving the subject is disclosed in JP-T No. 2007-527626. FIG. 2 shows the structure of this existent example 1. FIG. 2A is a view showing a cross section of a Ge photodiode in the existent example 1. In an SOI (Silicon On Insulator) substrate in which a silicon dioxide ($SiO_2$) layer 102 and an upper Si layer 103 are formed on an Si substrate 101, Ge layer 104 is formed by epitaxial growing in a region surrounded by an $SiO_2$ film 105, and p-type and n-type ion implantation regions 106 and 107 are alternately formed intermittently in the upper portion of the Ge layer 104. FIG. 2B is a plan view showing a photodiode device structure of the existent example 1 on the side of the substrate surface, and FIG. 2A corresponds to a cross section of FIG. 2B along line a in FIG. 2B. Since the implantation regions can be formed deeply in the Ge layer and the distance between p/n electrodes can also be shortened, the time in which electron-hole pairs generated by light absorption reach the electrodes can be shortened while ensuring a sufficient thickness of the light absorption layer. As described above, a plurality of means have been proposed for improving the trade-off relation and the performance of the Ge photodiodes has been improved every year.

On the other hand, for the photodiodes used in the optical communication system, amplification function is required depending on the application use thereof. Usually, high frequency signals converted into electric signals by a photodiode are amplified in a amplification circuit such as a trans impedance amplifier in an integrated circuit. Since a problem such as increase of a noise index results in the amplification by the electric circuit in a case of amplifying small signals, it is necessary to amplify optical signals and convert them into electric signals. The photodiode having the function includes an avalanche photodiode. The device utilizes the phenomenon that electron-hole pairs generated between p/n junctions are subjected to avalanche amplification by an electric field applied to a depletion layer and this is a device essential to the amplification of small optical signals. However, the avalanche photodiode requires high operation voltage in view of the characteristics that it is used in an electric field region of avalanche amplification, and is poor in view of low power consumption performance. Further, the amplification performance is in a trade-off relation with the high speed operation performance, and an upper limit value is present for a GB product as a product of an amplifiable frequency and an amplification factor. At present, group III-V compound semiconductors such as gallium arsenide (GeAs) and indium phosphate (InP) applied to the optical communication involve a problem that the GB product is small in a case of use as the avalanche photodiode, though the light absorption characteristics are excellent. Accordingly, in an application use of requiring light amplification, optical signals are once converted into electric signals by a usual photodiode using a compound semiconductor and then the electric signals are amplified by an Si avalanche diode of higher GB product, which results problems such as increase in the number of production steps, increase of the chip size, and lowering of the flexibility upon circuit design. Accordingly, it has been required to provide a photodiode having high amplification factor, excellent in high speed performance, and also having less power consumption performance.

A bipolar phototransistor formed by providing a bipolar transistor with a light absorption performance has been noted in that the high speed performance and high current amplification factor of the bipolar transistor can be utilized. Particularly, since the bipolar phototransistor and the bipolar transistor can be manufactured by substantially identical processes, it is expected as a device capable of hybridizing a photodiode and a current amplification circuit.

However, a trade-off relation between the high speed performance and the photoreceiving efficiency is present also in the bipolar phototransistor like in the photodiode. FIG. 3 shows a principle view for the operation of a bipolar transistor. In a bipolar phototransistor, light is absorbed in a depletion layer between a base and a collector and, among generated electron-hole pairs, holes flow to the base in an npn transistor and electrons flow to the base in a pnp transistor, to change the energy level of the emitter relative to the base. Thus, the energy barrier to the electron is lowered in the npn transistor, while that to the hole is lowered in the pnp transistor, to cause current amplification by electrons and holes respectively. In this case, for efficiently converting an incident light into electron-hole pairs and injecting sufficient carriers to the base, it is necessary to increase the width of a depletion layer between collector/base. However, since increase of the depletion layer width between collector/base increases the running time of carriers, this deteriorates the high speed performance of the transistor. As means for solving the subject, JP-A-Sho57(1982)-207383 discloses a bipolar phototransistor in which the width of the depletion layer between collector/base is changed for the photoreceiving portion and the amplification portion. FIG. 4 is a cross sectional view of a bipolar phototransistor disclosed in the existent example 2. The drawing shows an n-type semiconductor, substrate 201 having impurities at high concentration, a light absorption layer 202 comprising a high resistance semiconductor layer, and an n-type semiconductor layer 204 at high concentration, and a region comprising the three layers forms a photoreceiving portion in a photodiode. Further, an n-type semiconductor region 203 at high concentration and an n-type semiconductor region 205 at high concentration form a bipolar transistor. That is, the p-type semiconductor layer 204 in the photodiode also serves as a base of the bipolar transistor, the n-type semiconductor substrate 201 and the high concentration n-type semiconductor layer 203 constitute a collector, and an n-type semiconductor layer 205 at high concentration constitutes an emitter thereby forming an amplification portion comprising the bipolar transistor. As can be seen from the drawing, the thickness of the light absorption layer 202 is ensured sufficiently in the photoreceiving portion, whereas the thickness of the high resistance layer 202 between the collector and the base of the bipolar transistor is thin. Therefore, it has a structure capable of sufficient absorption of light in the photoreceiving portion and high speed operation of the transistor in the amplification portion. As described above, also in the bipolar phototransistor, compatibility between the high efficiency of the photoreceiving sensitivity and high operation speed of the device has been proposed.

However, irrespective of several break through proposed so far, compatibility between the high speed performance and the high efficiency property cannot be said sufficient in the bipolar type photodiode having the amplification function and a further improvement is required for the performance upon wide application to high speed optical communication systems. One of the reasons that the improvement of the performance is insufficient is increase of capacitance. As the factor determining high speed performance, the photodiode or the phototransistor includes inter p/n capacitance governing the charge and discharge of carriers in addition to the carrier running time described above. The capacitance increases along with decrease of the width of inter p/n depletion layer and it is in a trade-off relation with to the carrier running time. Accordingly, even when the carrier running time is shortened, since the charge/discharge time of the carriers attributable to the inter p/n capacitance hinders the high speed performance, the high speed performance cannot be improved sufficiently. Particularly, since a large area is required for a photodiode used in optical communication in order to efficiently convert an incident light into an electric current, degradation of the high speed performance caused by the increase of the capacitance is severe. For example, it is necessary that the surface incident type photodiode has a photoreceiving portion of 30 μm diameter in a high speed optical communication system at 10 GHz for a wavelength band of 1.55 μm and the effect of inter p/n capacitance is extremely large.

The effect of the capacitance described above is further increased in the bipolar phototransistor shown in the existent example 2. The existent example is designed such that the width of the depletion layer between the collector and the base is decreased in order to improve the high speed performance of the bipolar transistor in the amplification portion. In the structure shown in FIG. 4, since the capacitance attributable to the photoreceiving portion of large area is further added, the capacitance of the bipolar transistor further increases. Accordingly, the effect of shortening the running time of the carriers by the addition of the high concentration semiconductor layer 203 is possibly offset by the capacitance increasing effect. If the photoreceiving area is decreased for decreasing the capacitance of the photoreceiving portion, since the number of carriers accumulated in the base is decreased, the amplification function of the transistor does not function sufficiently. Therefore, in the bipolar phototransistor, there is a subject how to decrease the capacitance while sufficiently keeping the area of the photoreceiving portion.

In a case where the subject described above issues a problem, compatibility between the high speed performance and the high efficiency performance shown in the existent example of JP-T-2007-527626 is no more effective means. Since the existent example mainly intends to shorten the running time of the carriers, the inter p/n, distance is short and the capacitance per unit area is large. Further, for the efficient conversion of light into electron-hole pairs, ions are implanted deeply in which the p/n junction area is large and the capacitance increases remarkably.

The present invention has been achieved in view of the subjects described above and it intends to provide a semiconductor photodiode device capable of decreasing the capacitance in the photoreceiving portion while sufficiently keeping the photoreceiving sensitivity and also shortening the carrier running time, as well as a manufacturing method thereof.

One of typical examples of the present invention is shown as described below.

That is, a semiconductor photodiode device according to an aspect of the invention includes: a semiconductor substrate; a first conduction type first semiconductor layer formed above the semiconductor substrate; a second semiconductor layer of high resistance formed above the first semiconductor layer; a first conduction type third semiconductor layer formed above the second semiconductor layer; and a second conduction type fourth semiconductor layer buried in the second semiconductor layer, in which the fourth semiconductor layer is separated at a predetermined distance in the horizontal direction above the surface of the semiconductor substrate.

Further, a method of manufacturing a semiconductor photodiode device according to an aspect of the invention includes the steps of: epitaxially growing a first conduction type first semiconductor layer above a semiconductor substrate; epitaxially growing a high resistance second semiconductor layer above the first semiconductor layer; applying patterning with an insulating film above the second semiconductor layer and epitaxially growing a second conduction type fourth semiconductor layer selectively; etching to remove the insulating film; epitaxially growing a second semiconductor layer again above the fourth semiconductor layer; and epitaxially growing the a first conduction type third semiconductor layer above the second semiconductor layer.

According to an aspect of the invention, it is possible to decrease the capacitance while keeping the area of the photoreceiving portion and shorten the running time of carriers generated by light absorption.

Figure 7A:
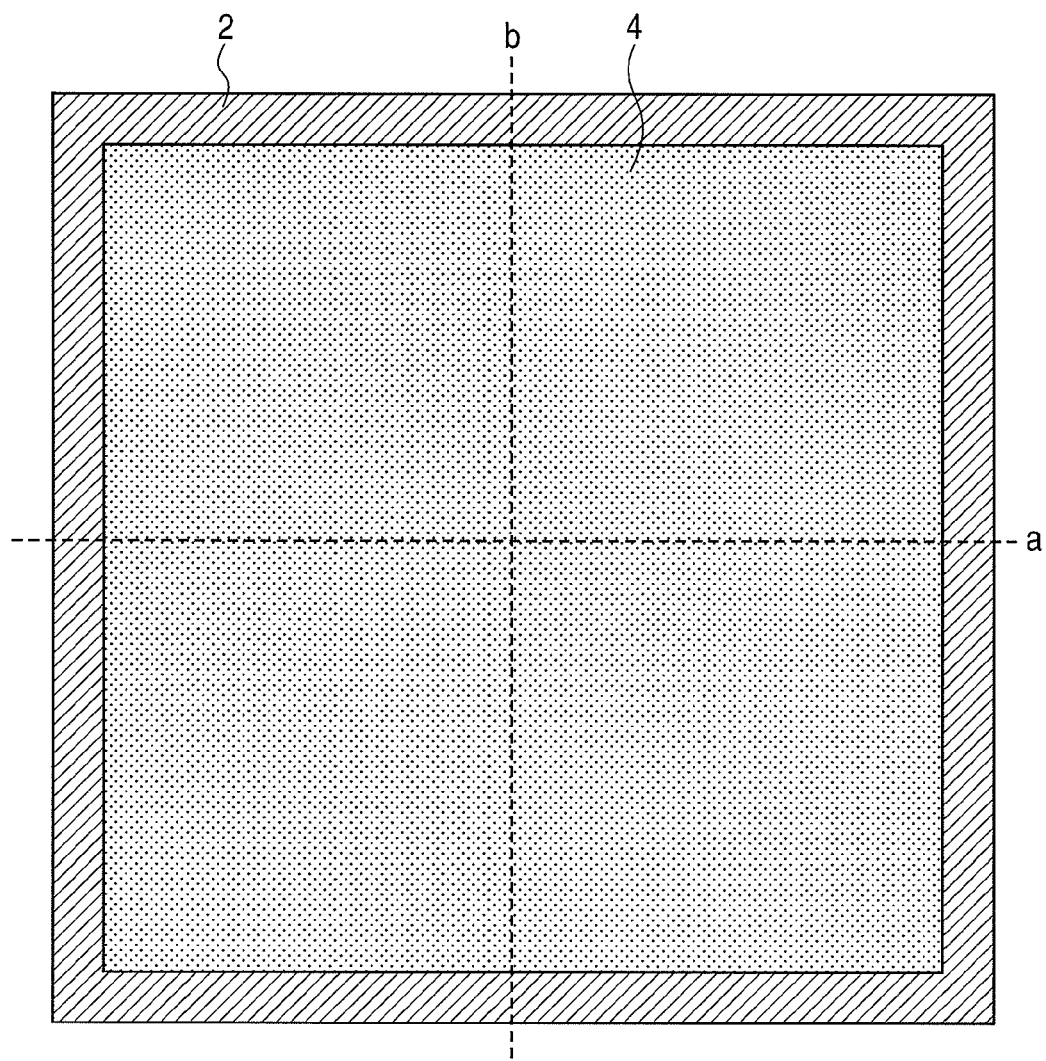
FIG. 7A is a cross sectional view showing a method of manufacturing a semiconductor photodiode in the first embodiment orderly.
Figure 7B:
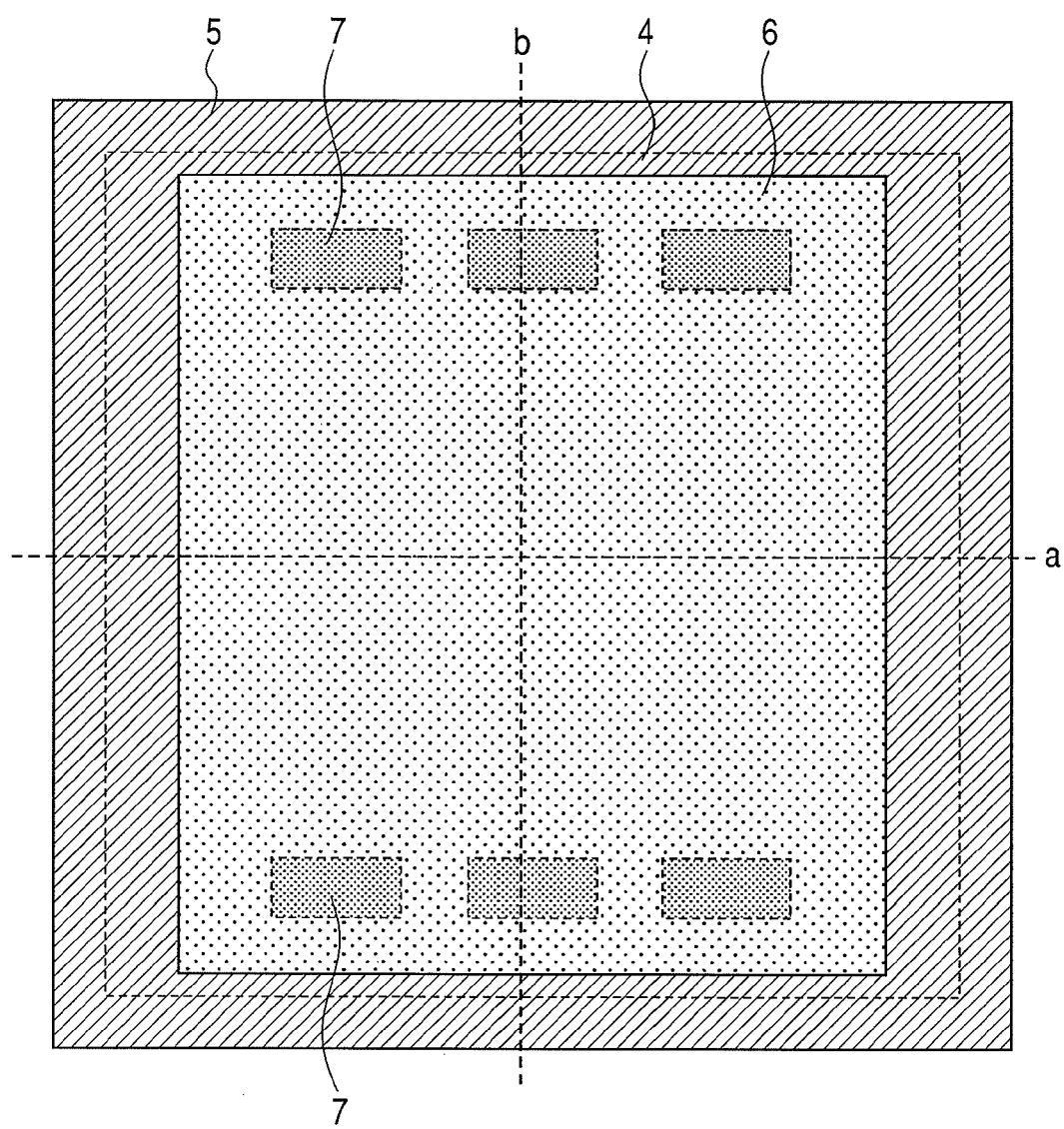
FIG. 7B is a cross sectional view showing a method of manufacturing a semiconductor photodiode in the first embodiment orderly.
Figure 7C:
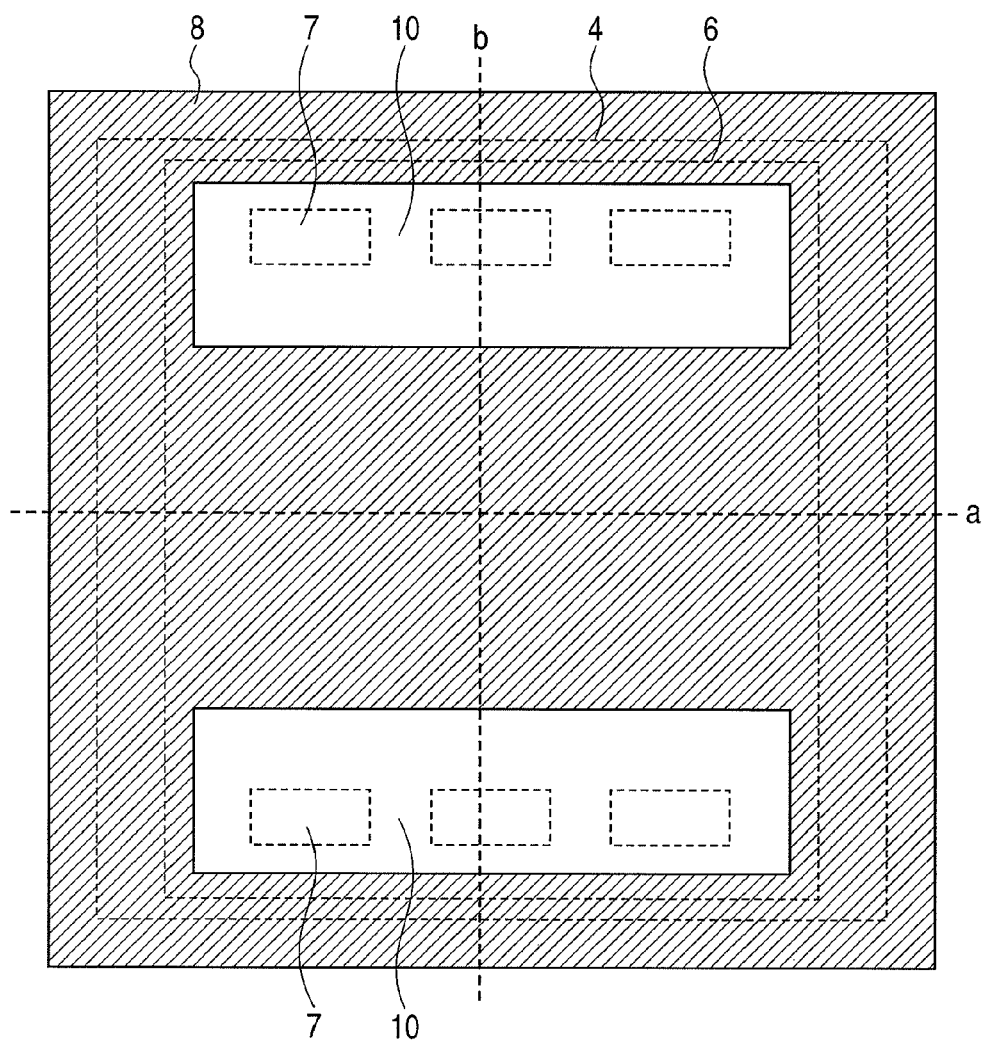
FIG. 7C is a cross sectional view showing a method of manufacturing a semiconductor photodiode in the first embodiment orderly.
Figure 7D:
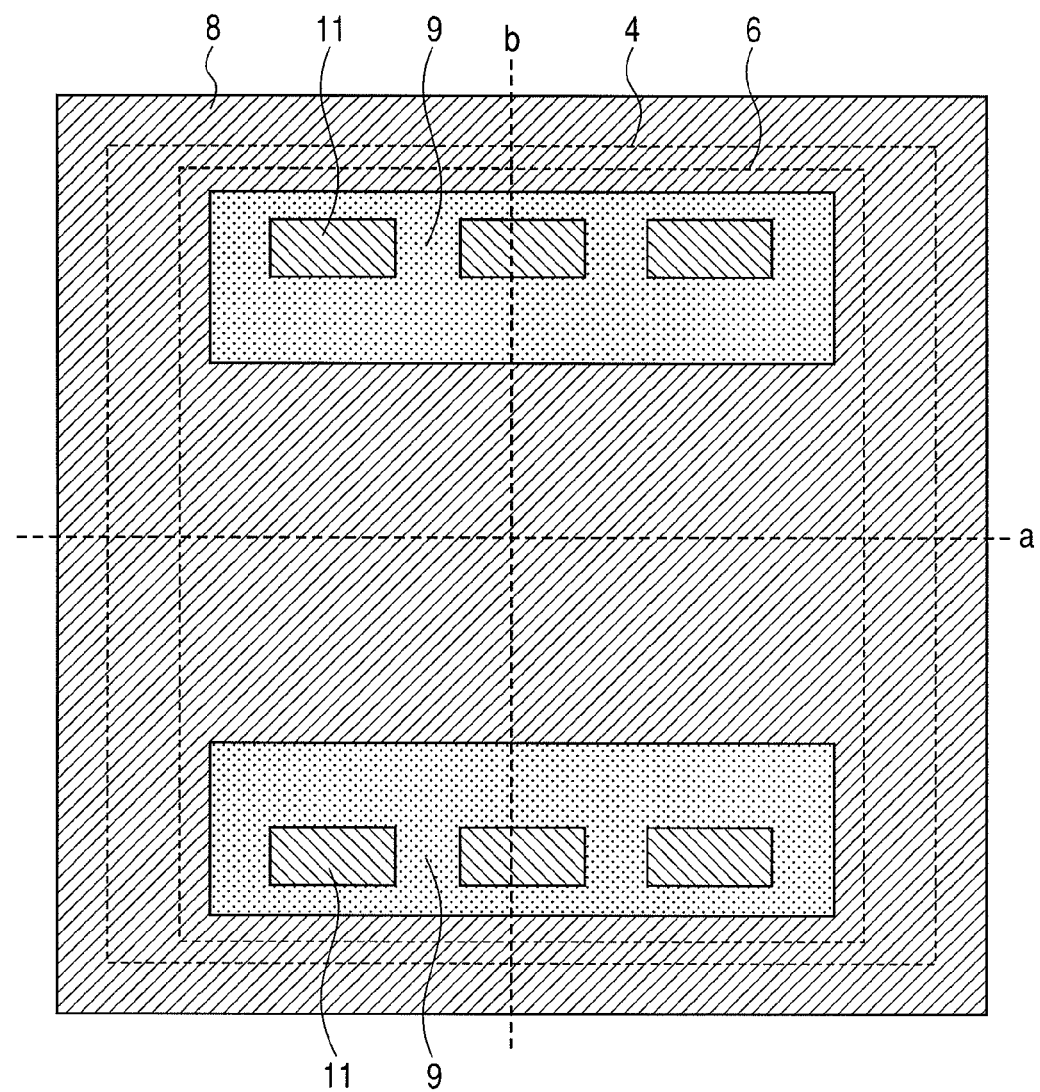
Figure 7E:
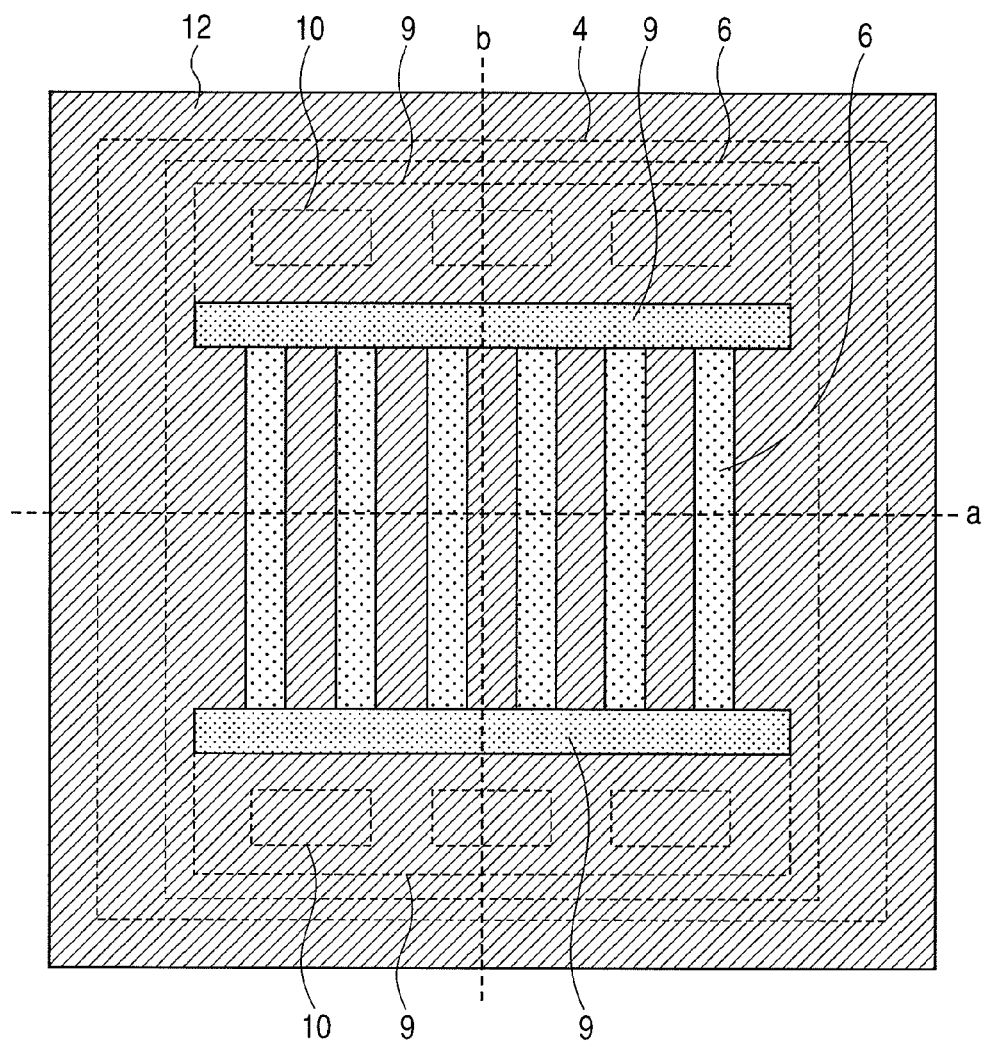
Figure 7F:
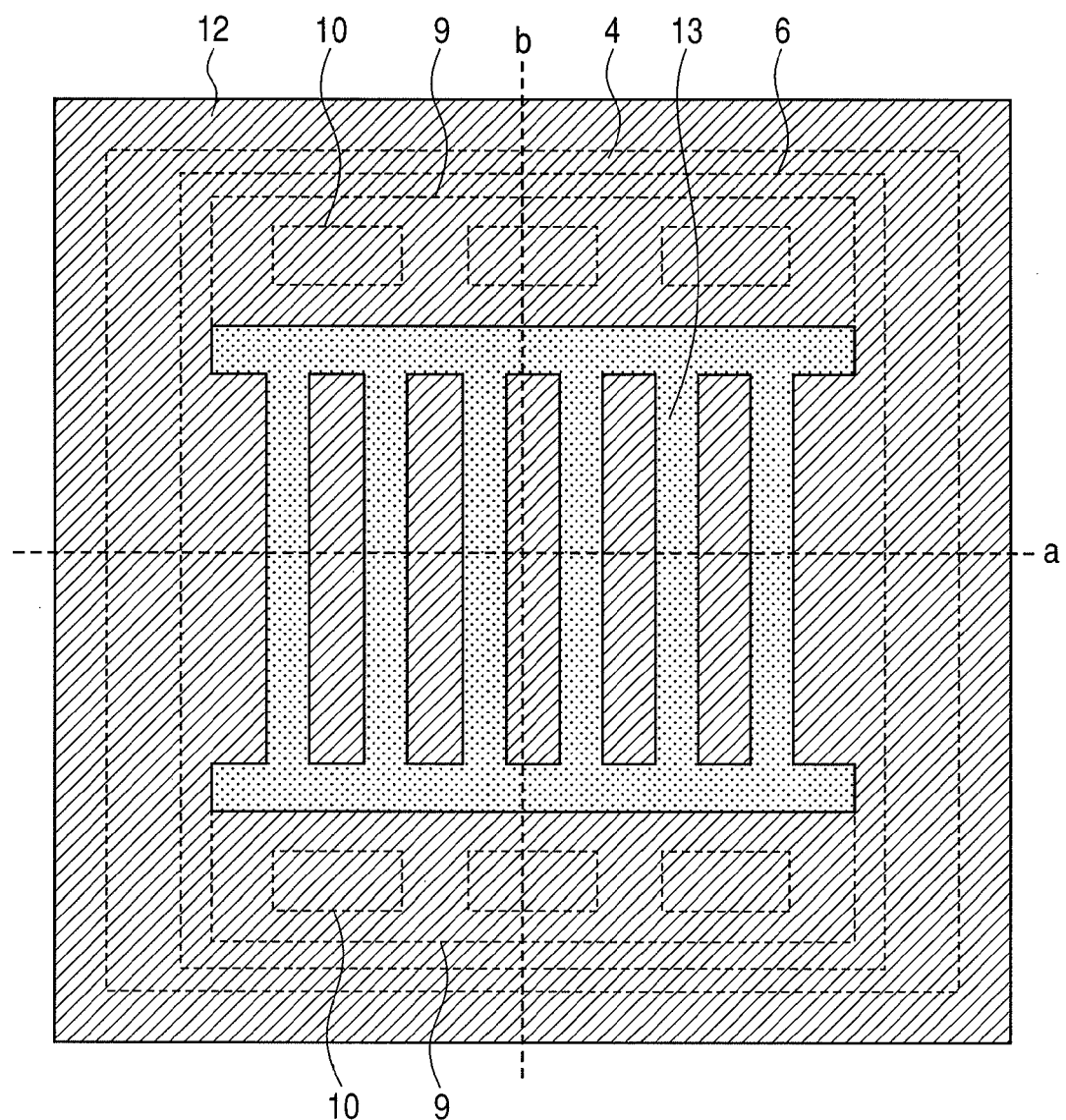
Figure 7G:
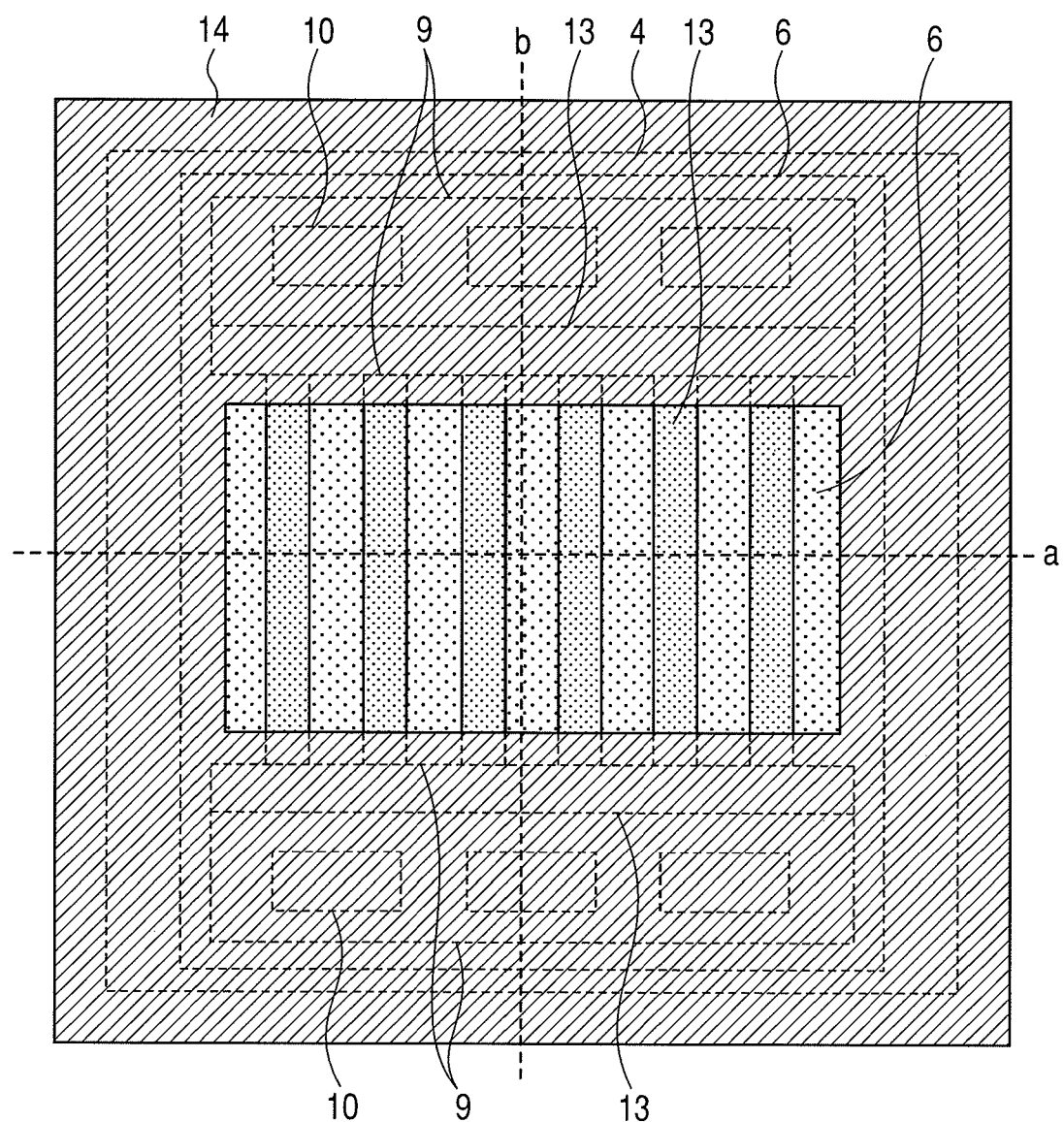
Figure 7H:
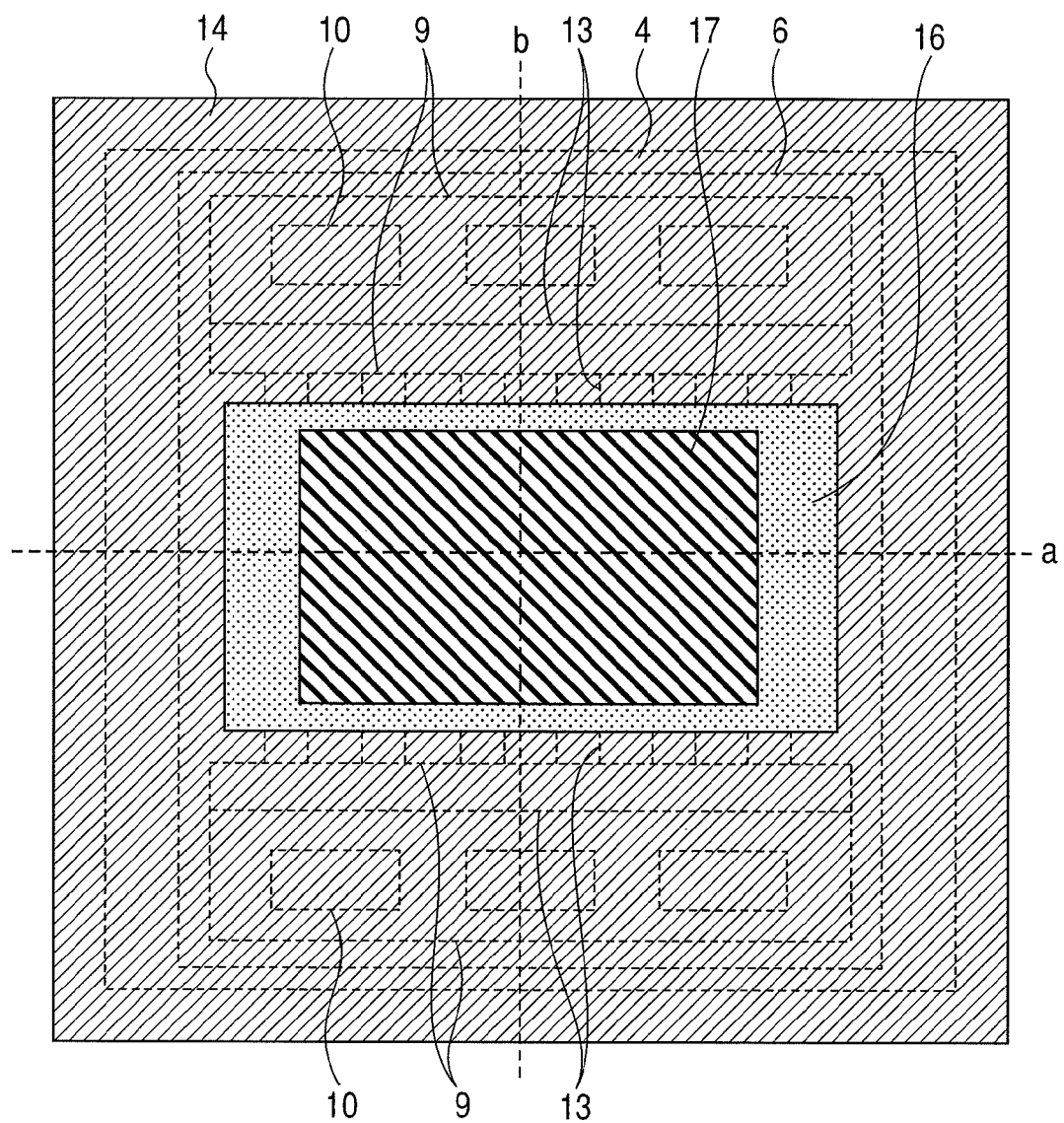
Figure 71:
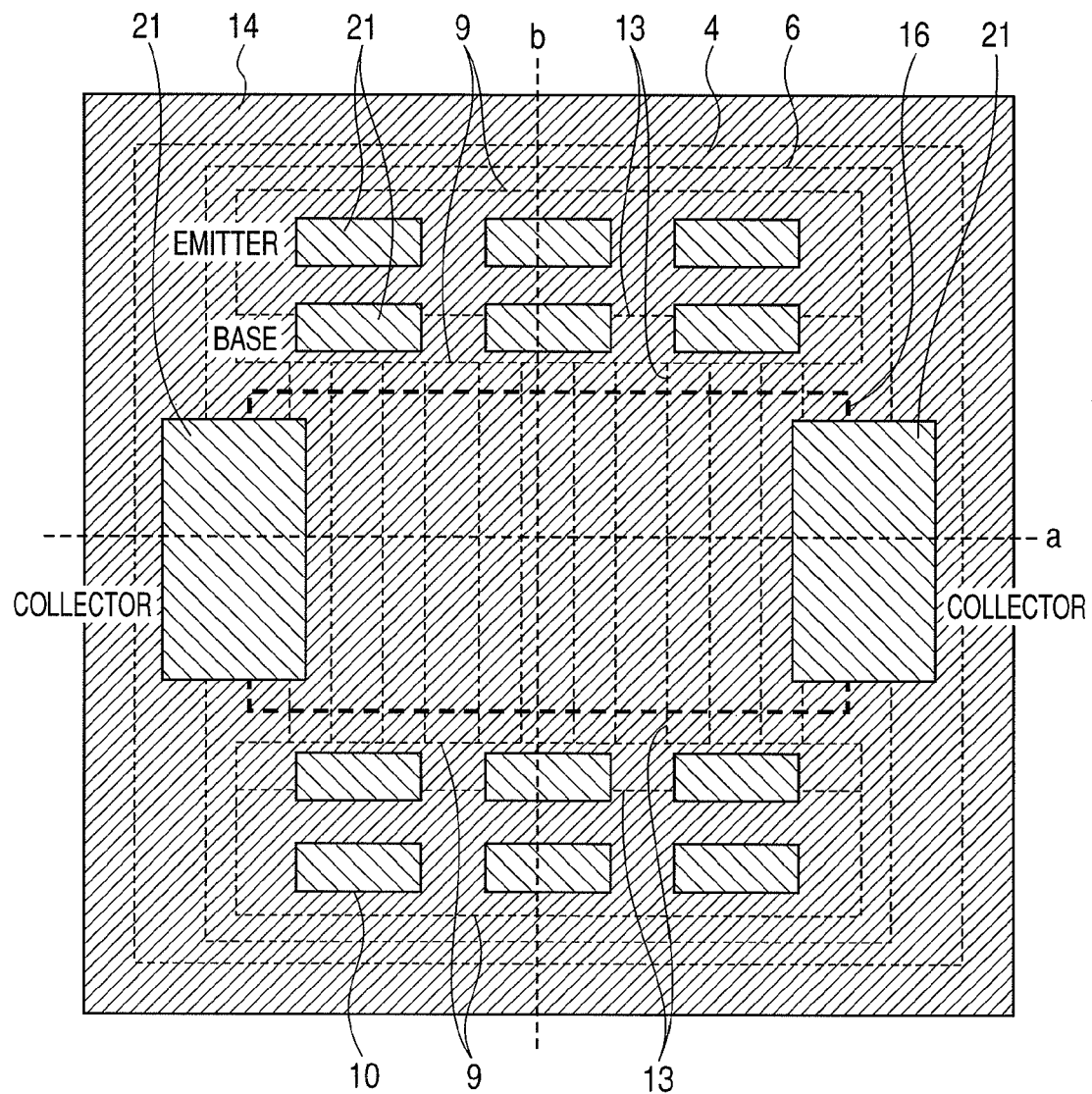
Figure 8A:
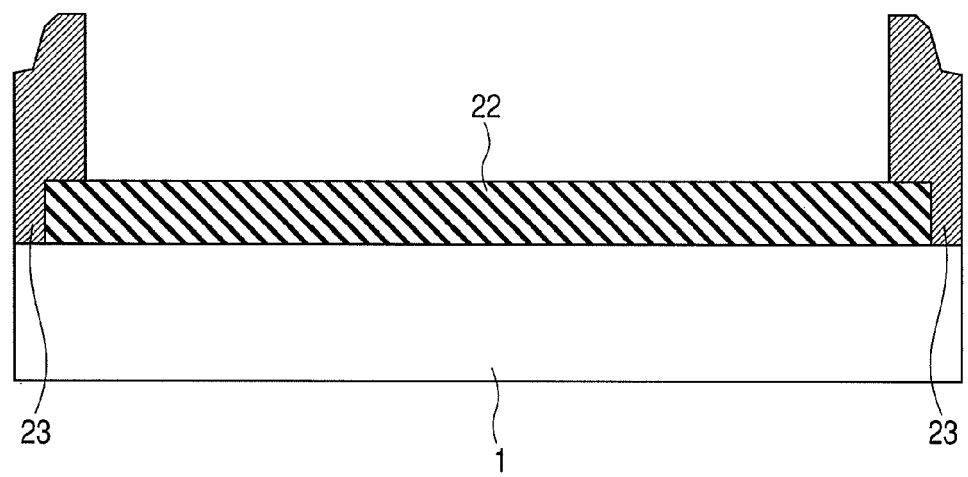
Figure 8B:
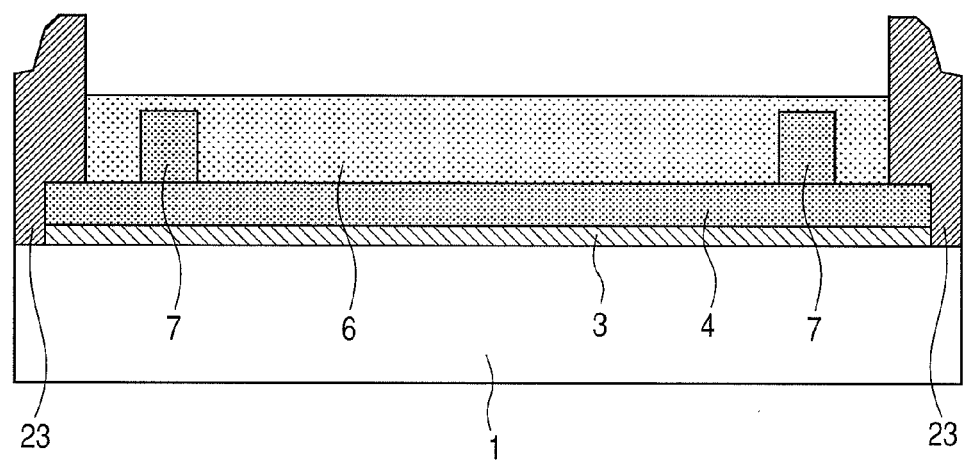
Figure 8C:
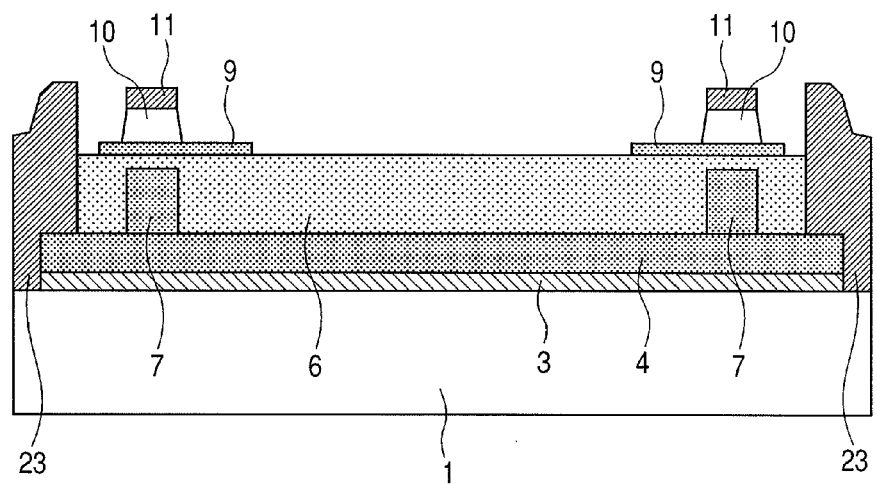
Figure 8D:
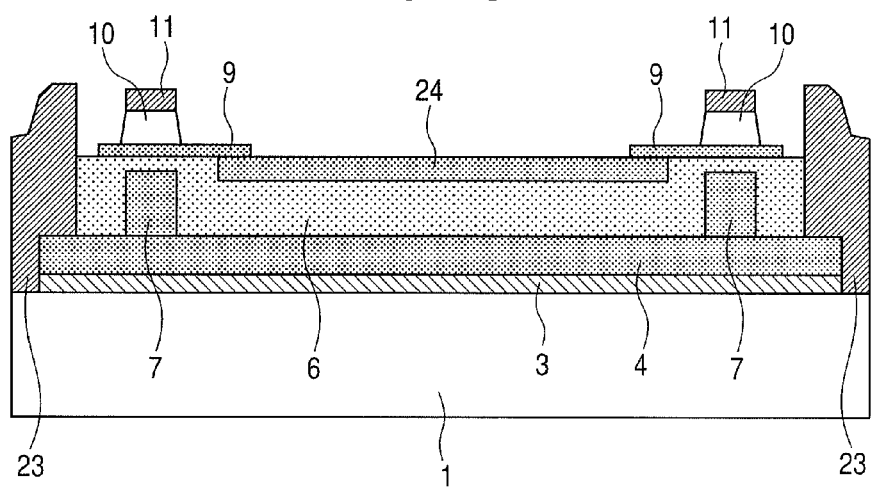
Figure 9A:
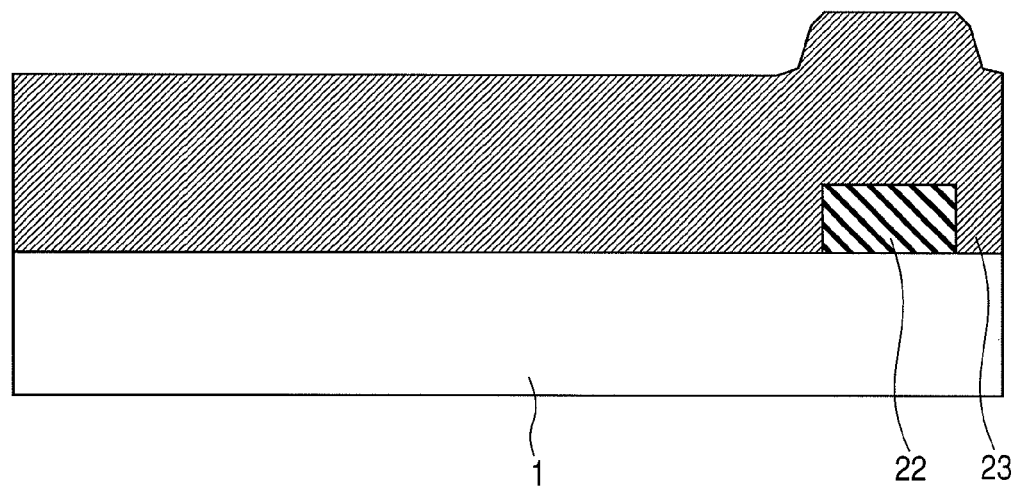
Figure 9B:
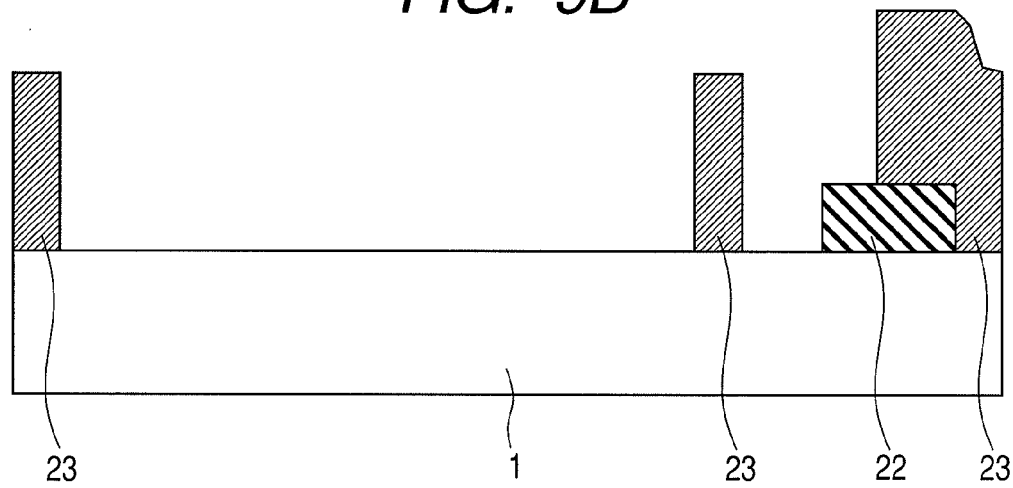
Figure 9C:
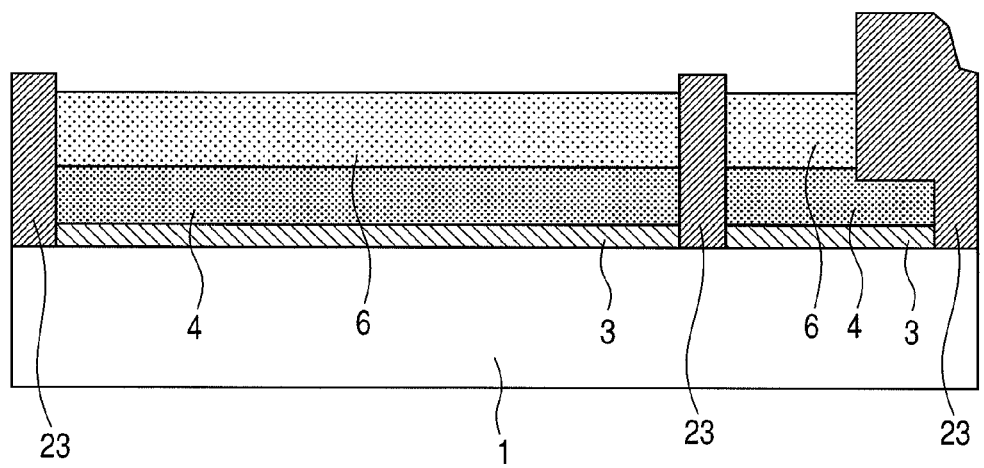
Figure 9D:
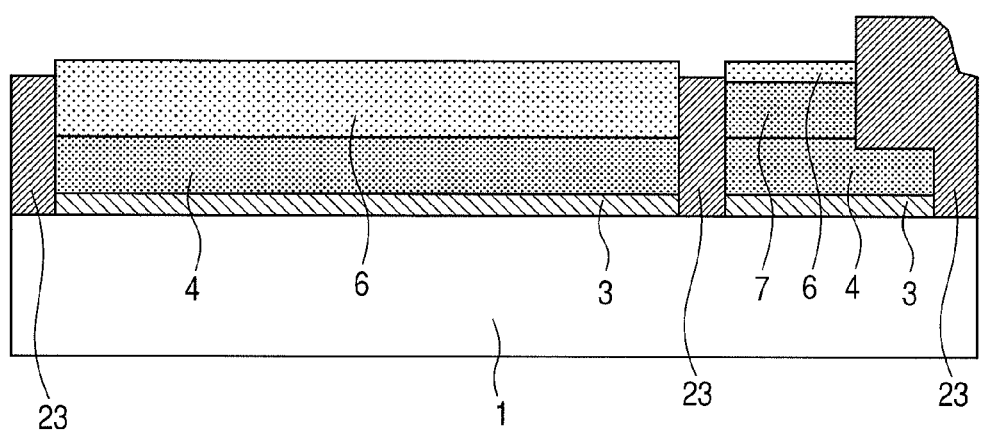
Figure 9E:
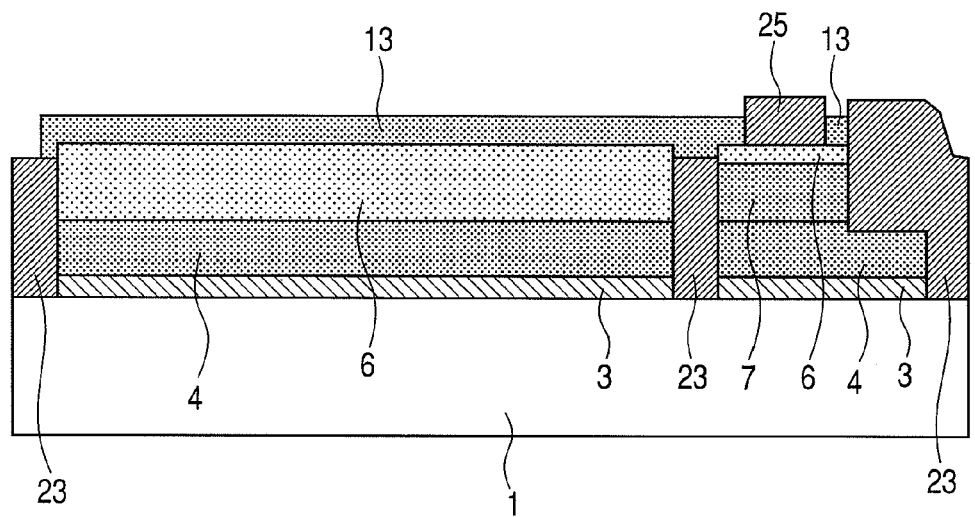
Figure 9F:
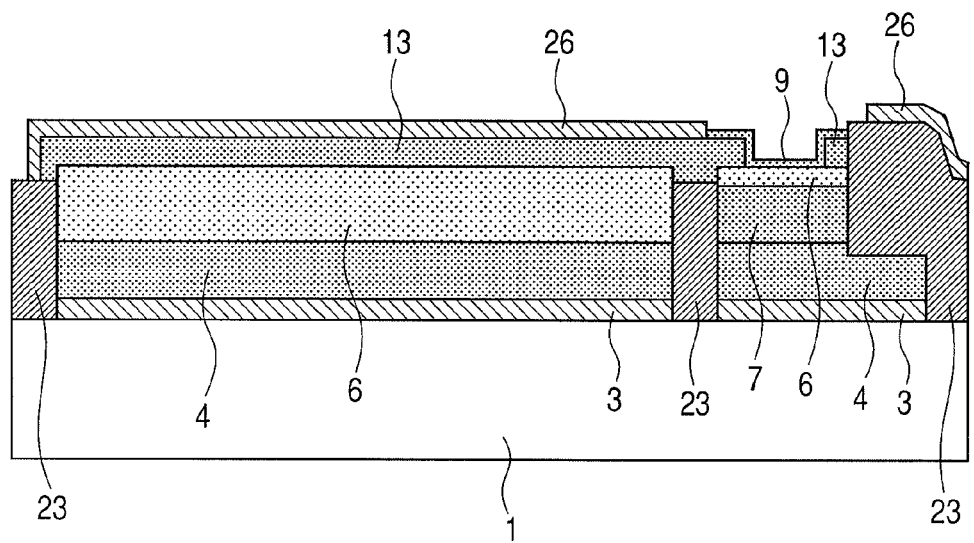
Figure 9G:
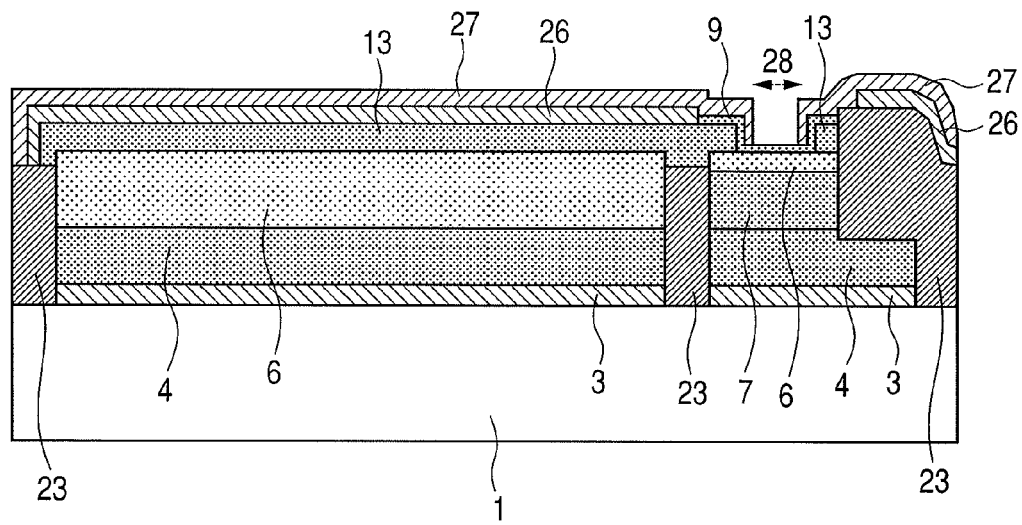
Figure 9H:
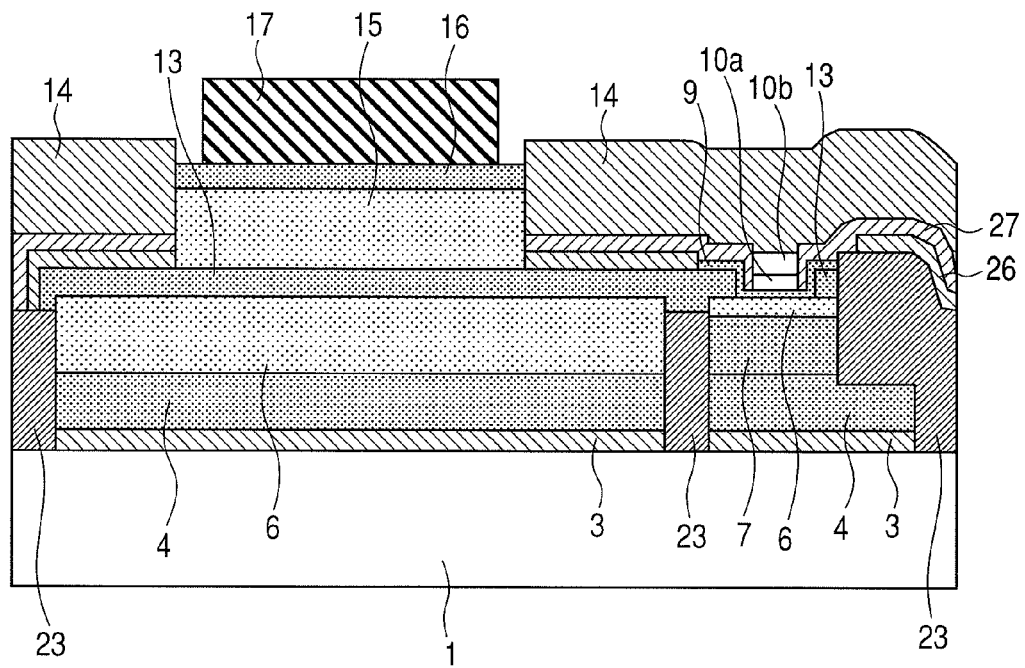
Figure 9I:
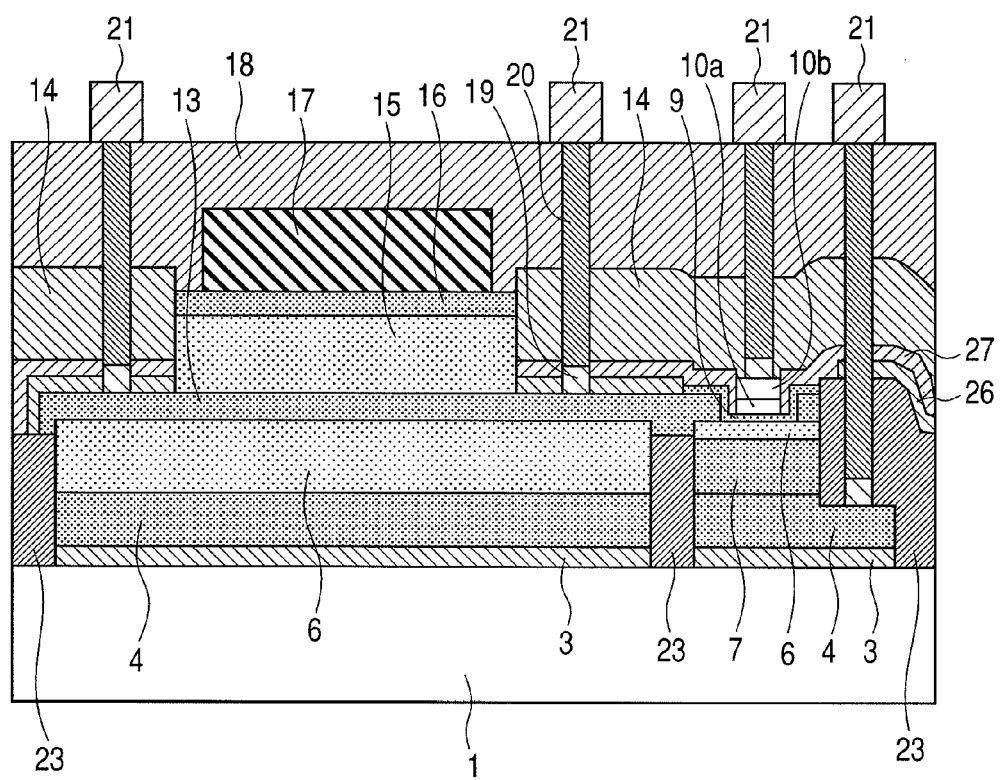
Figure 10:
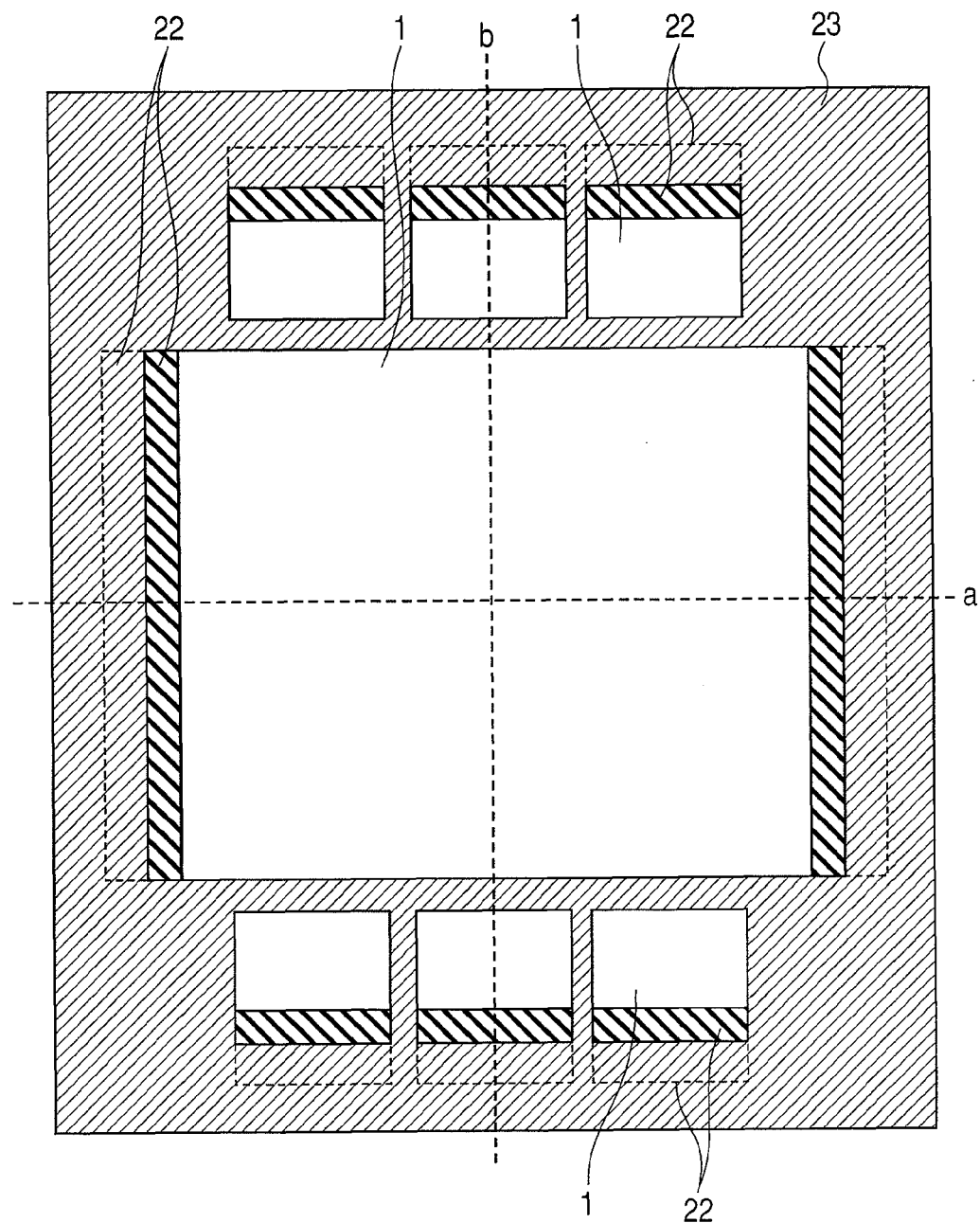
Figure 11:
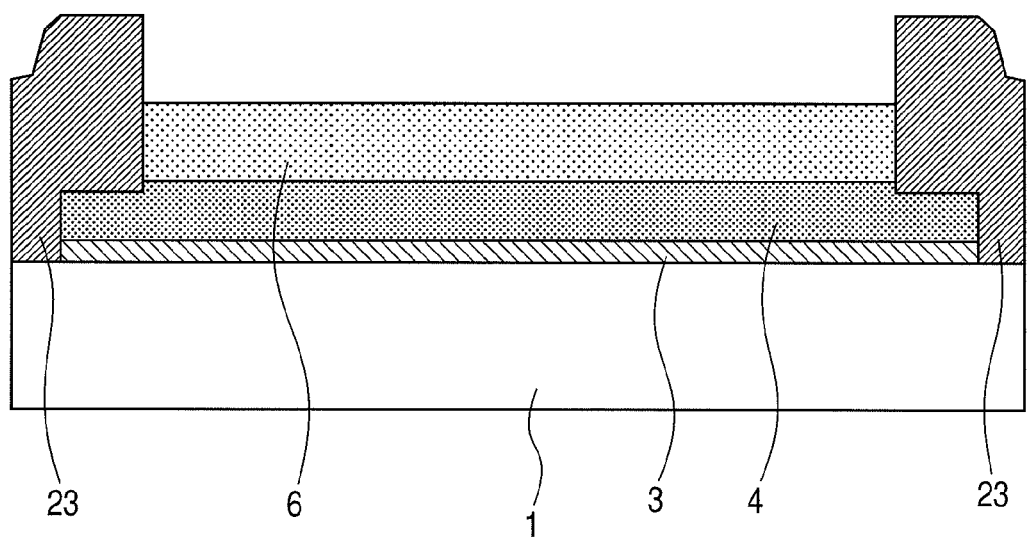
Figure 12:
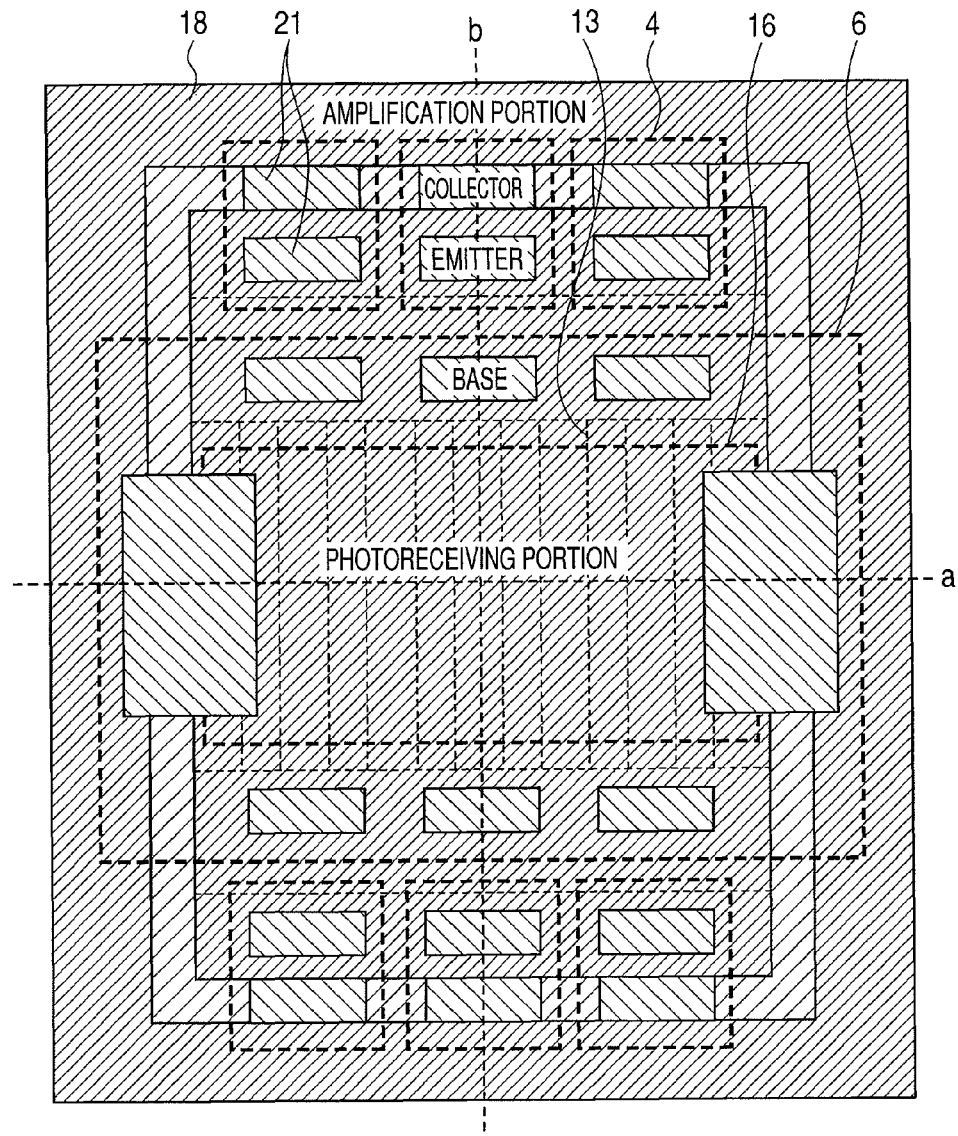
Figure 13:
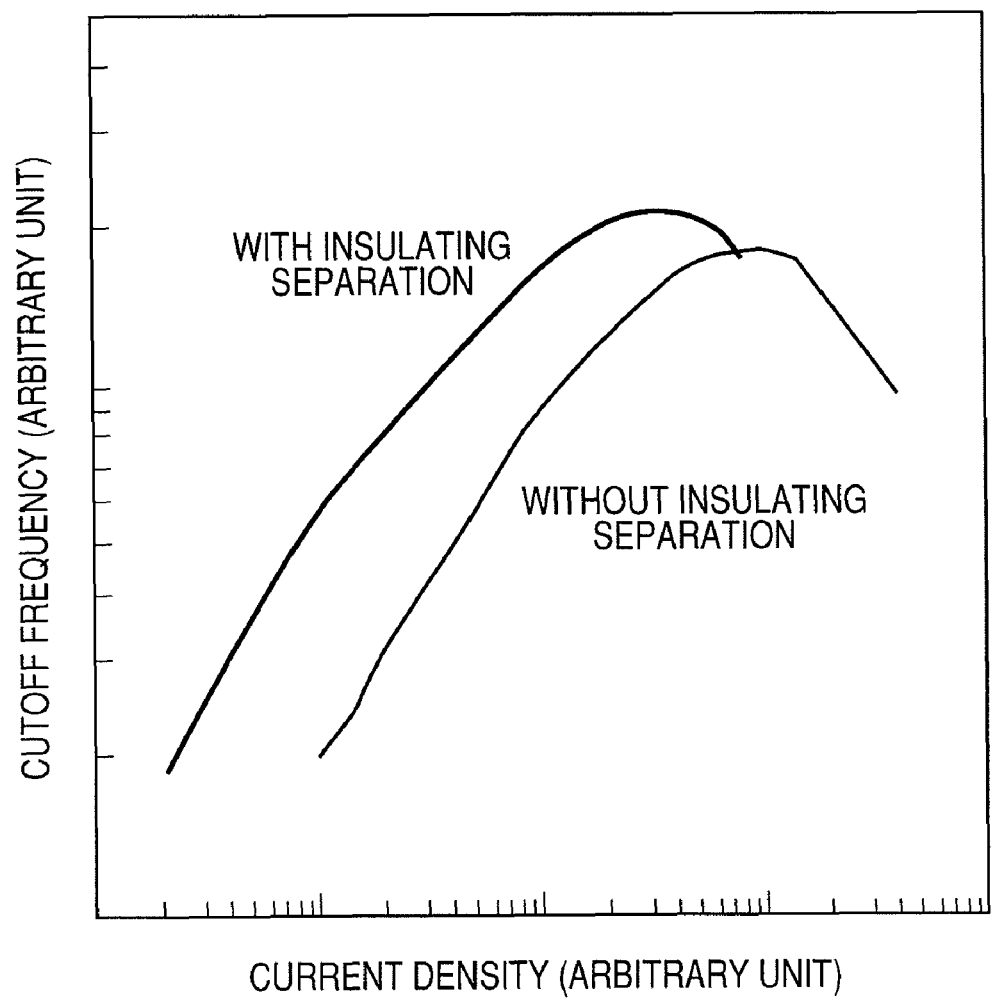
Figure 14A:
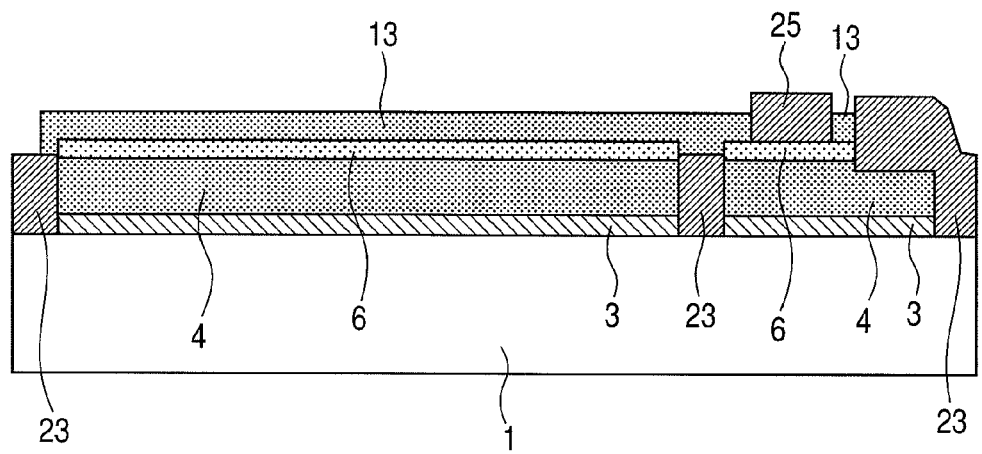
Figure 14B:
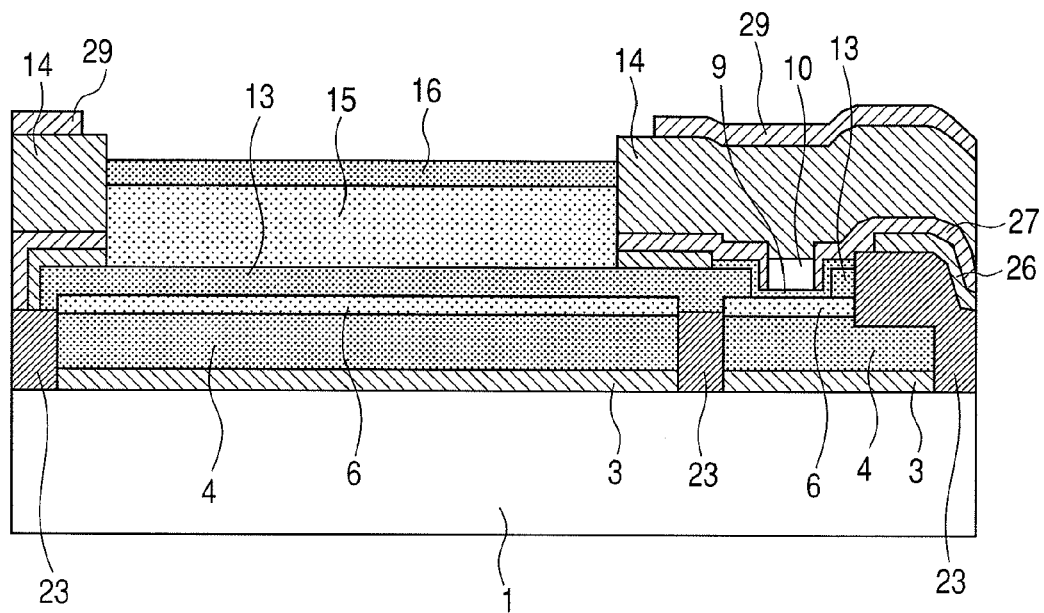
Figure 14C:
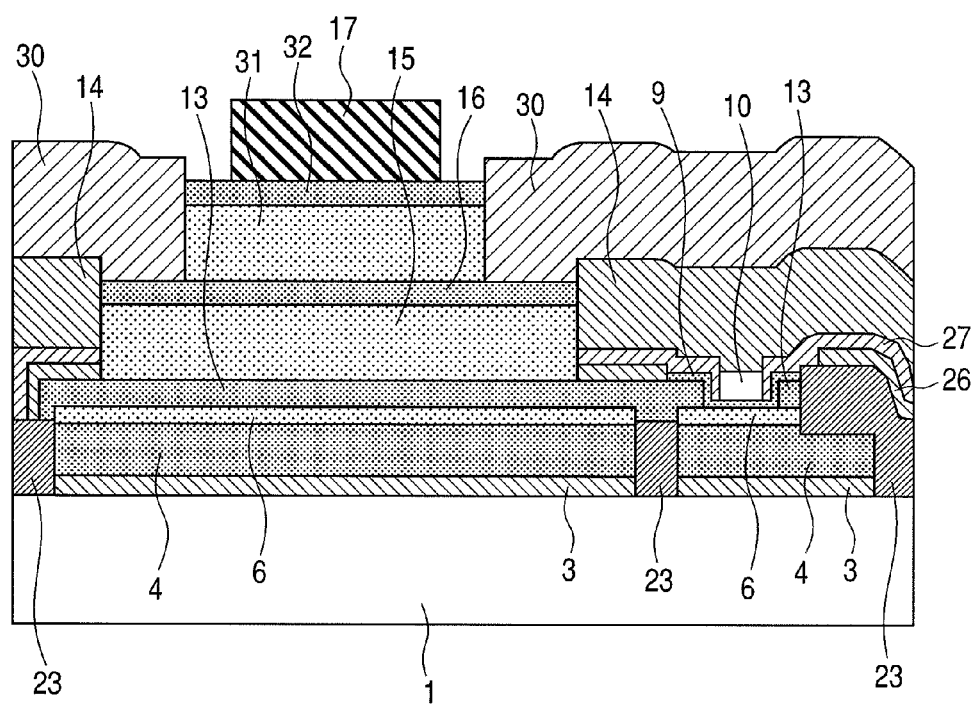
Figure 14D:
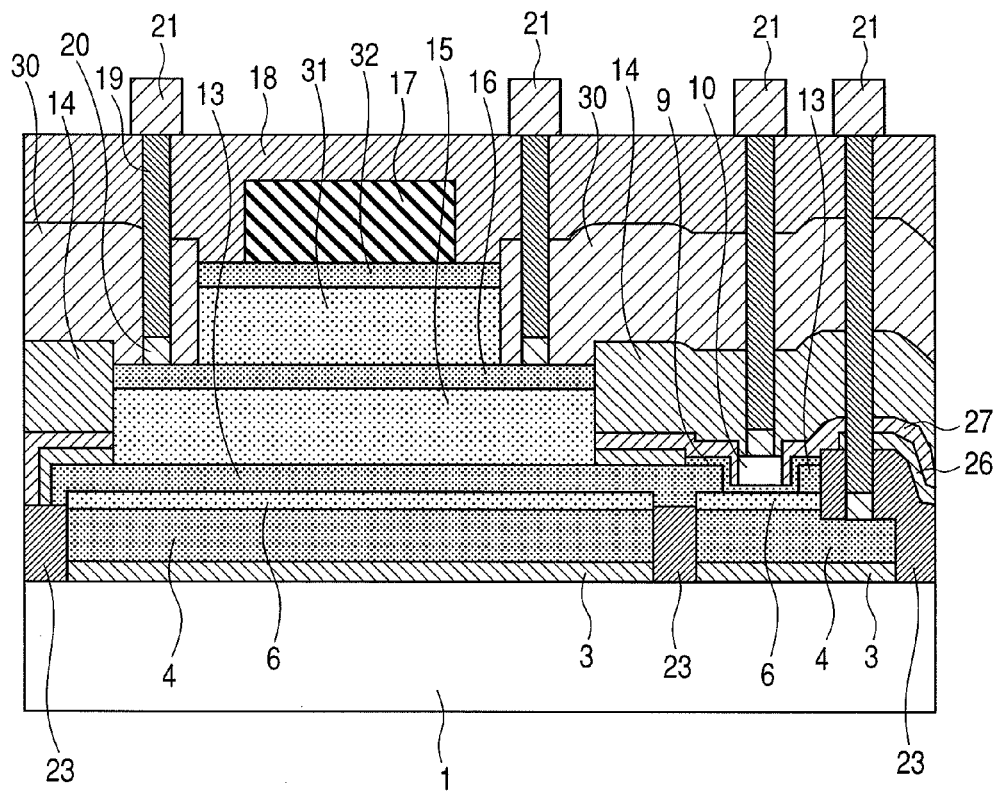
Figure 15A:
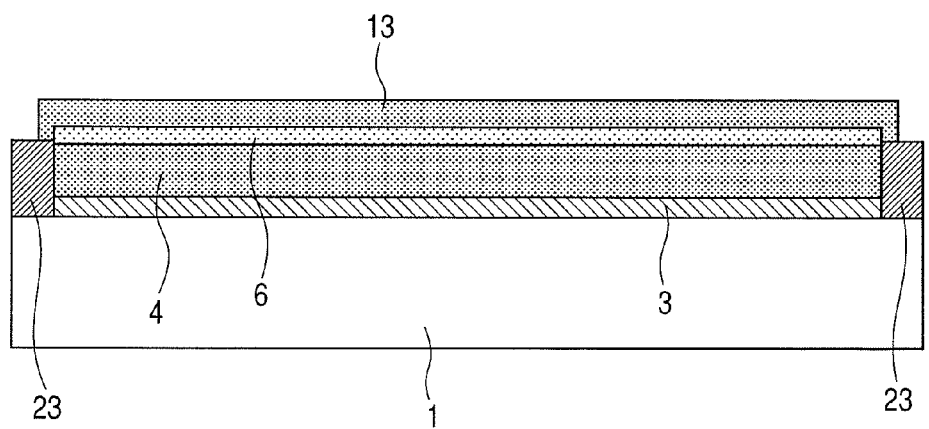
Figure 15B:
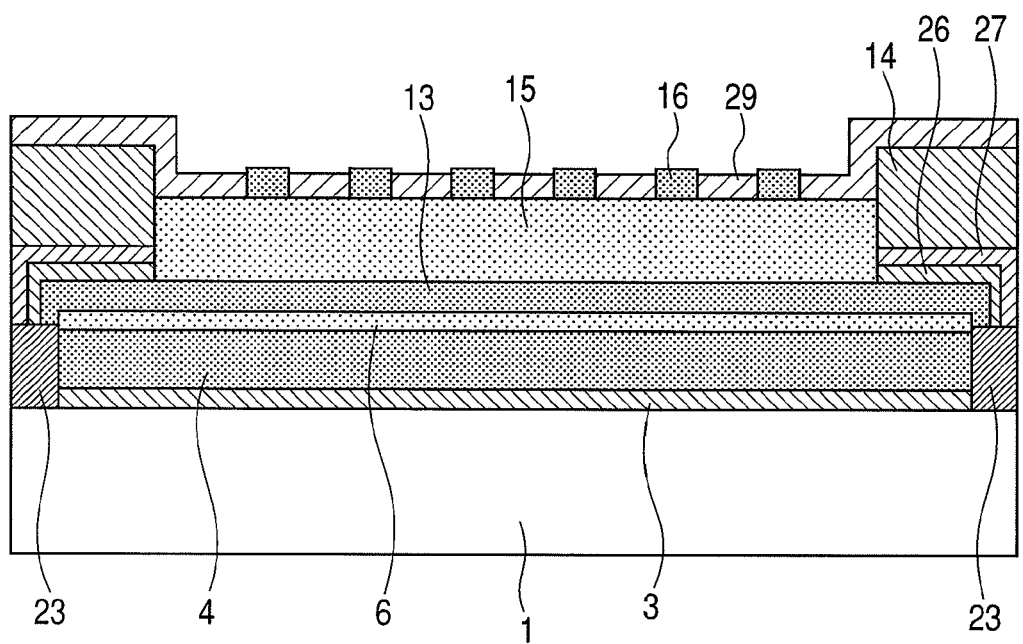
Figure 15C:
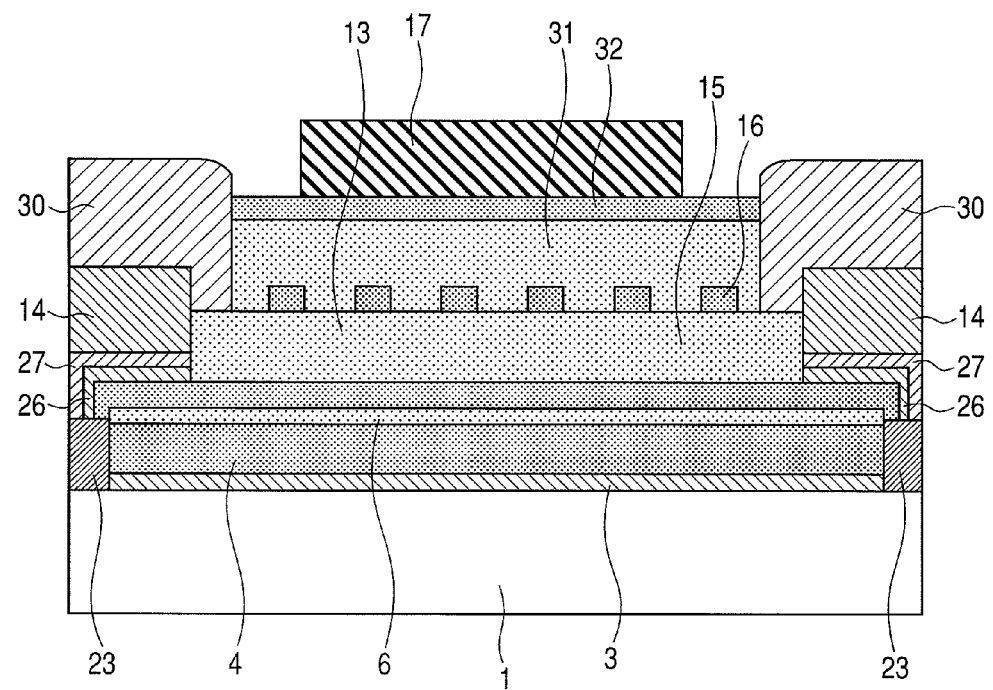
Figure 15D:
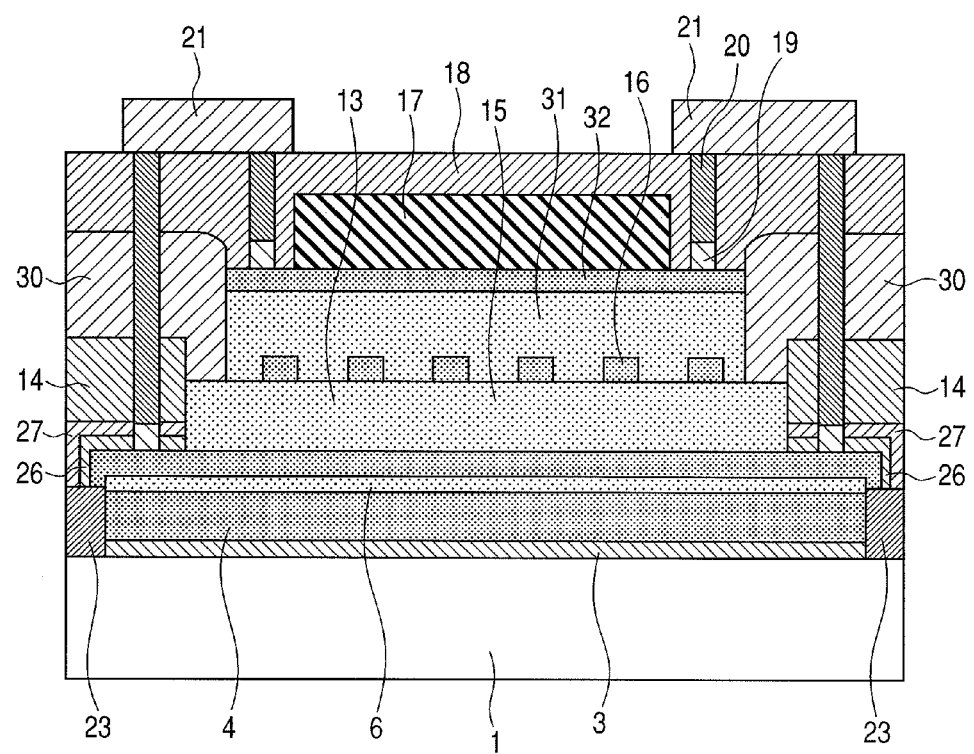
Figure 16:
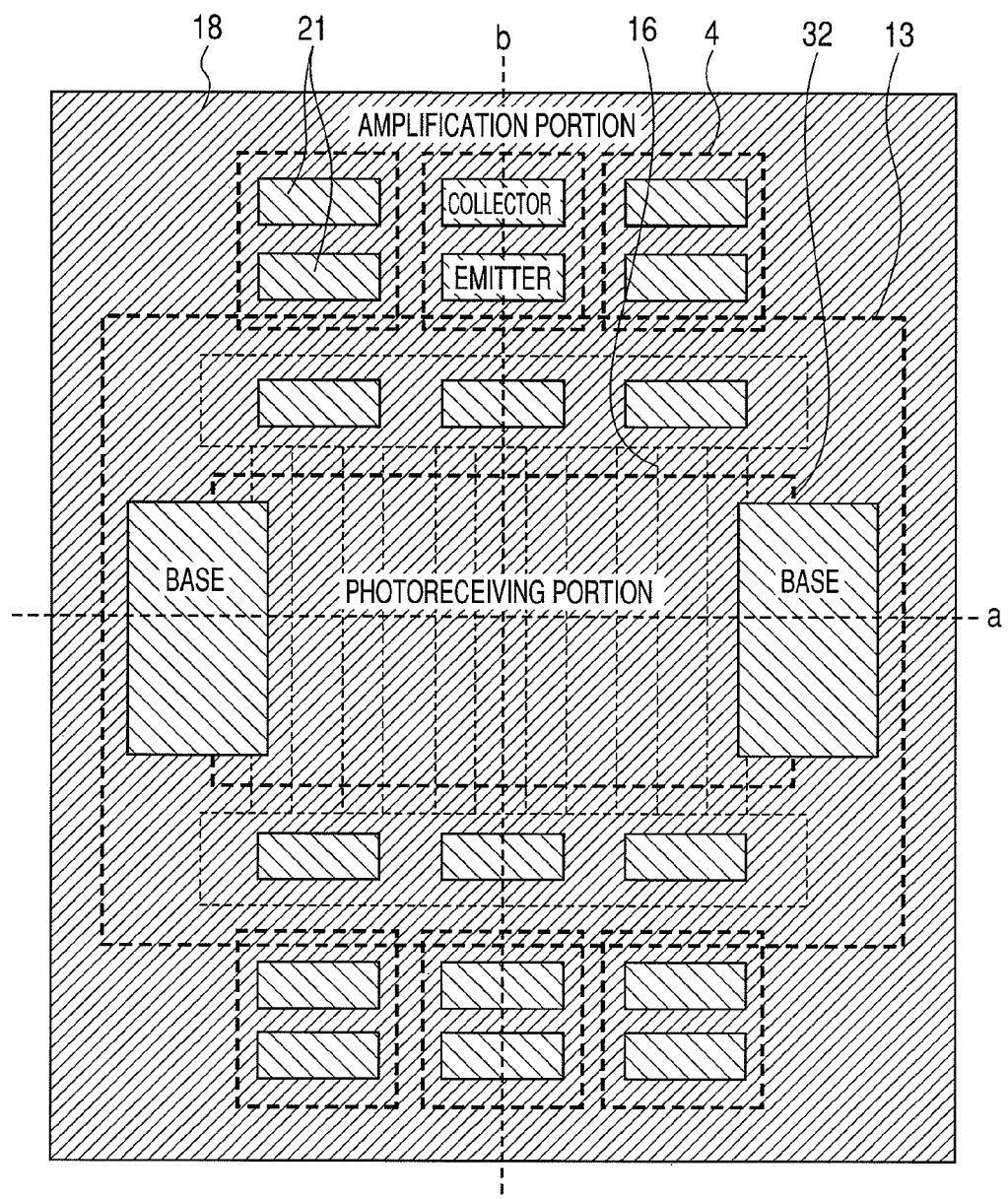
Figure 17A:
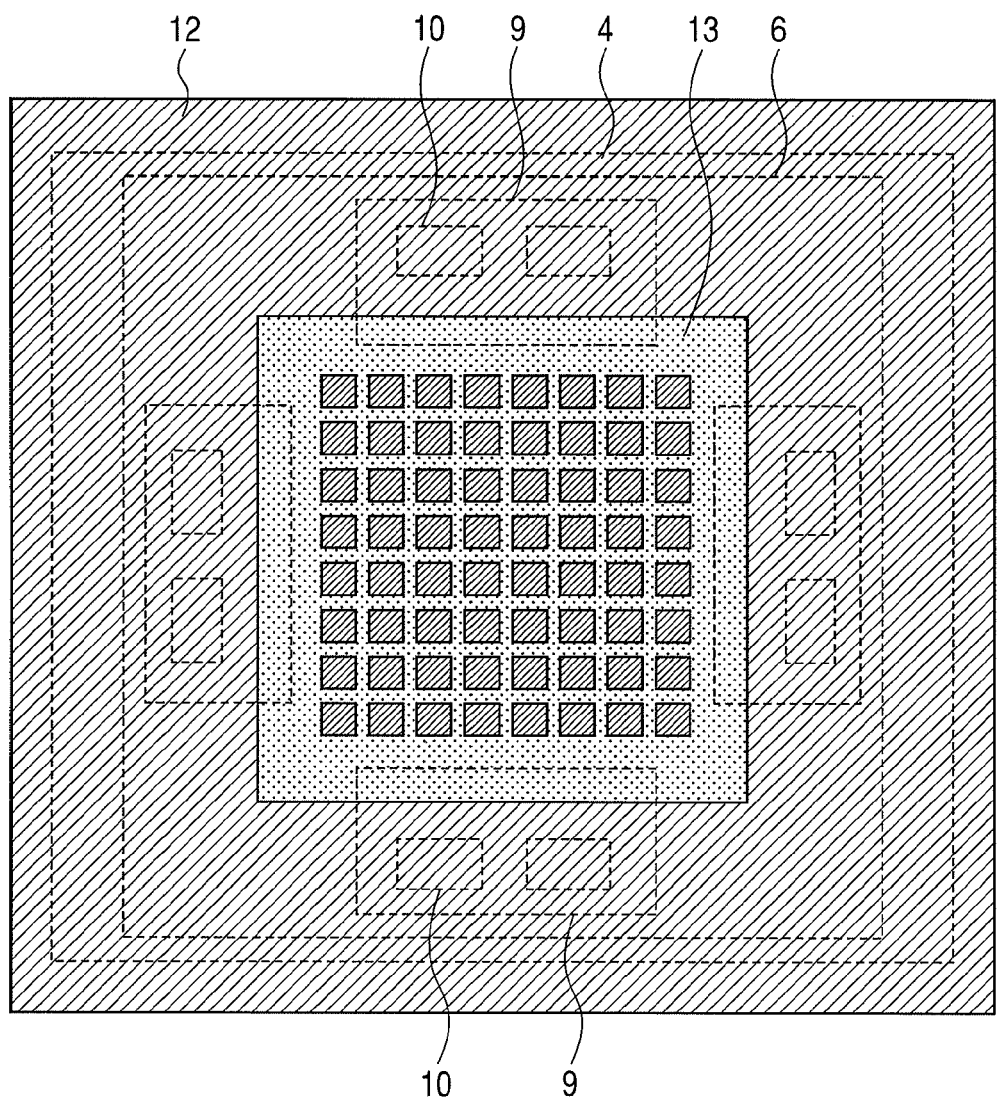
Figure 17B:
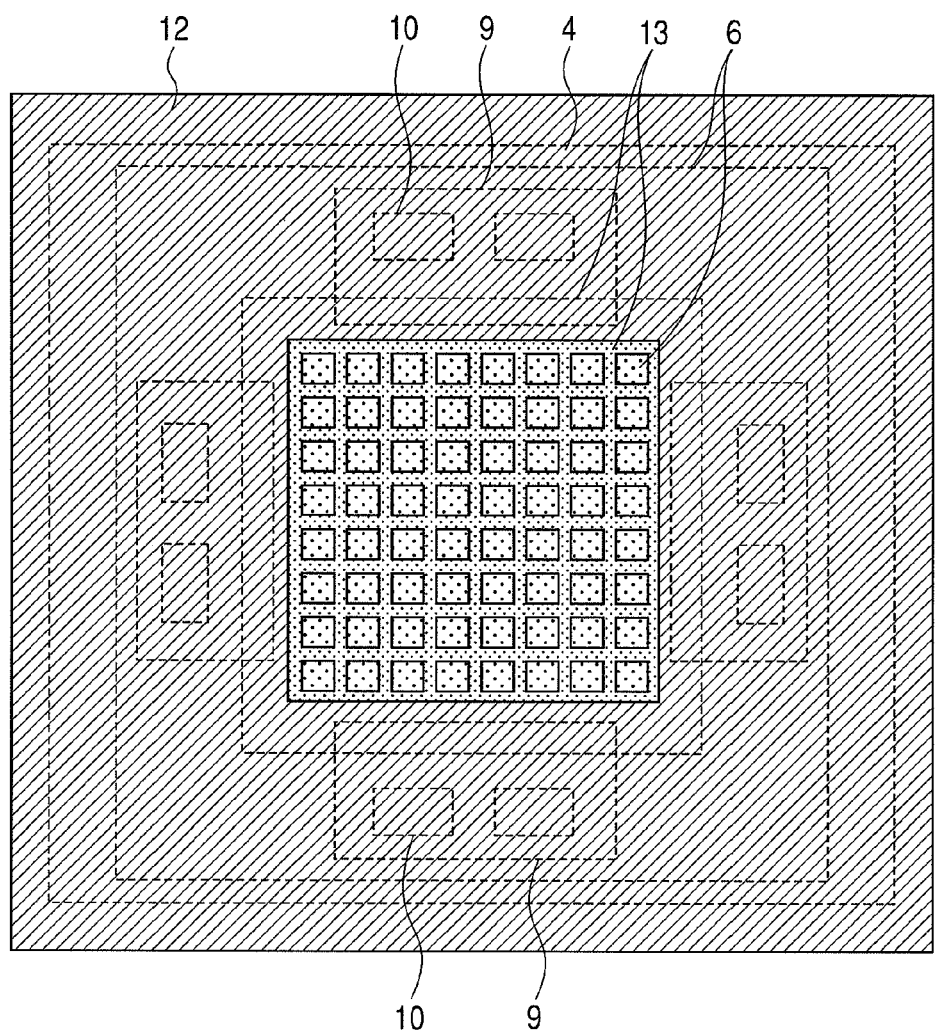
Figure 18A:
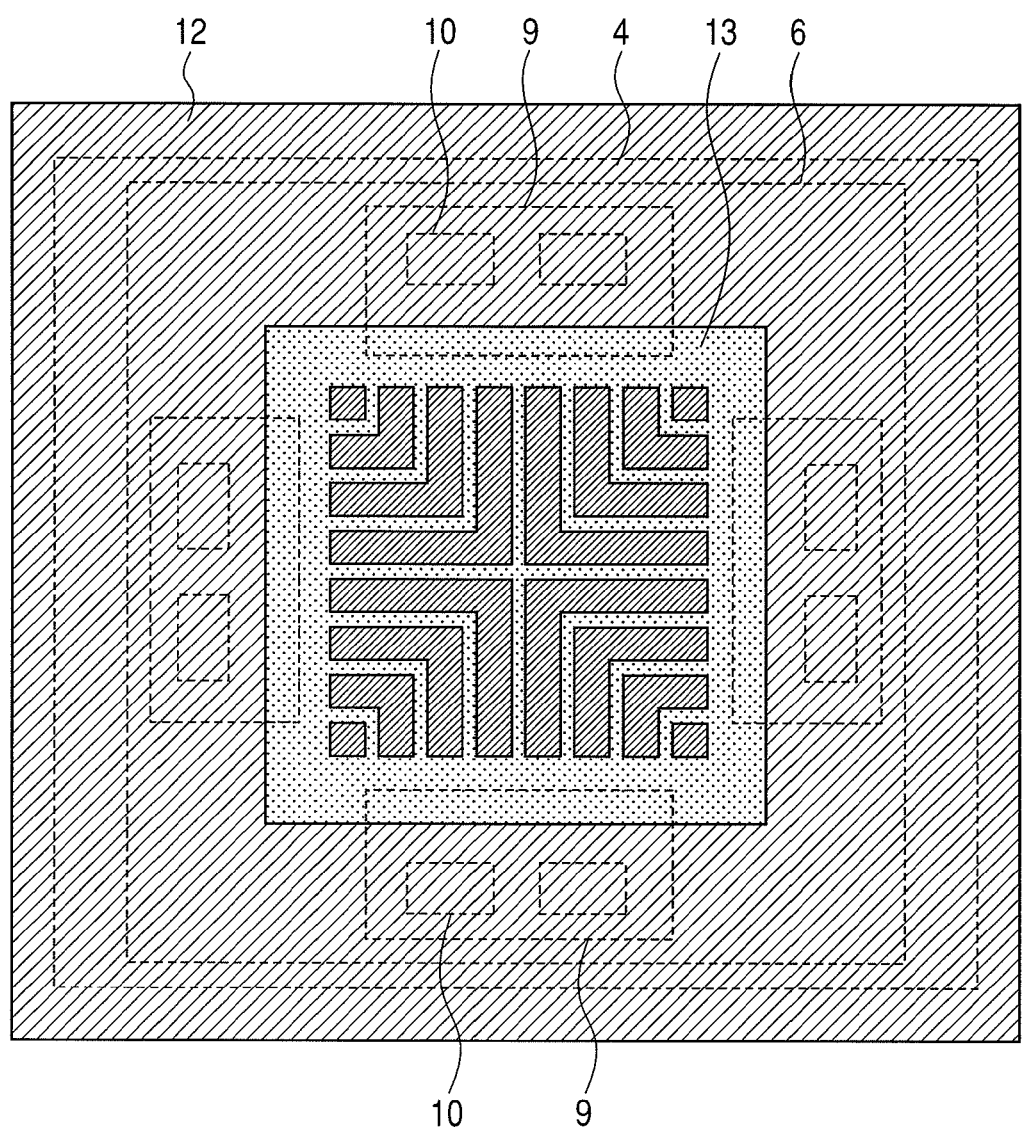
Figure 18B:
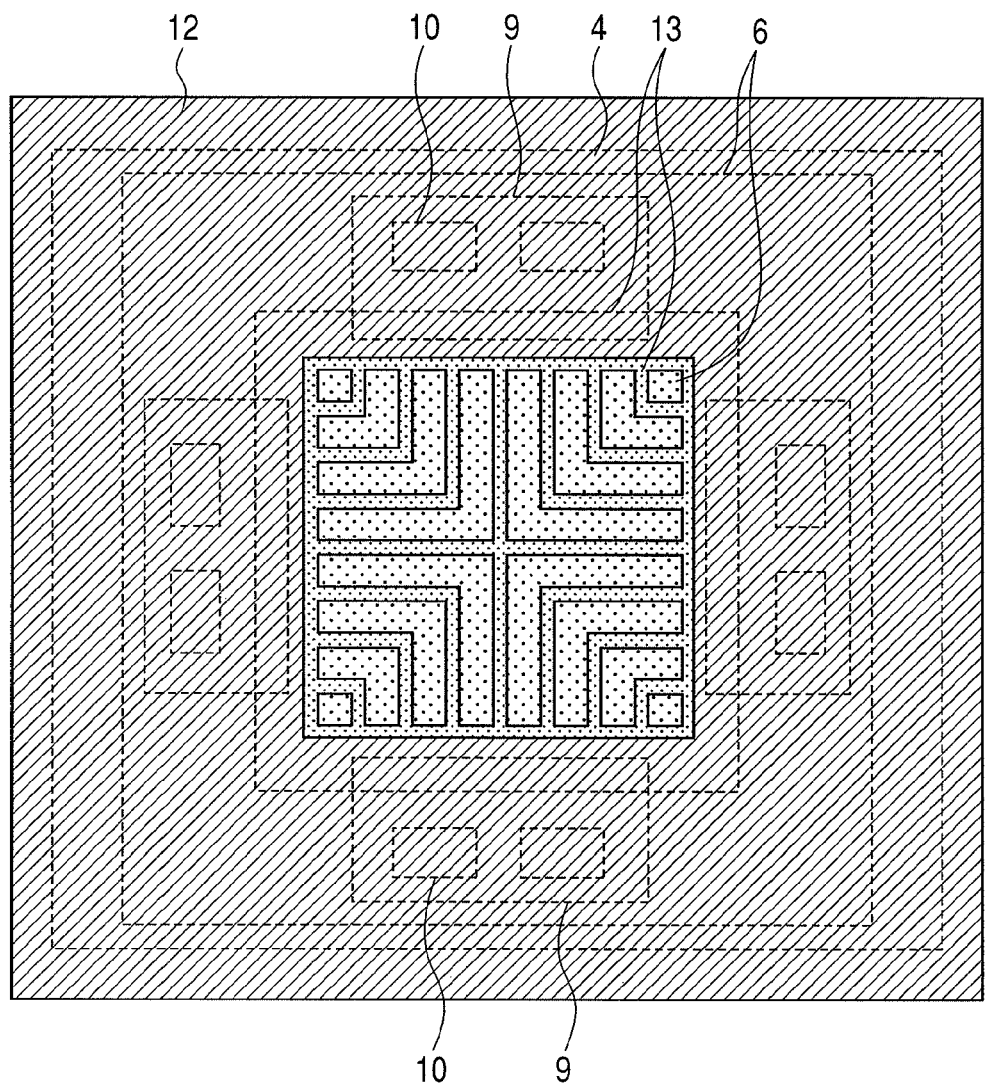
Figure 19:
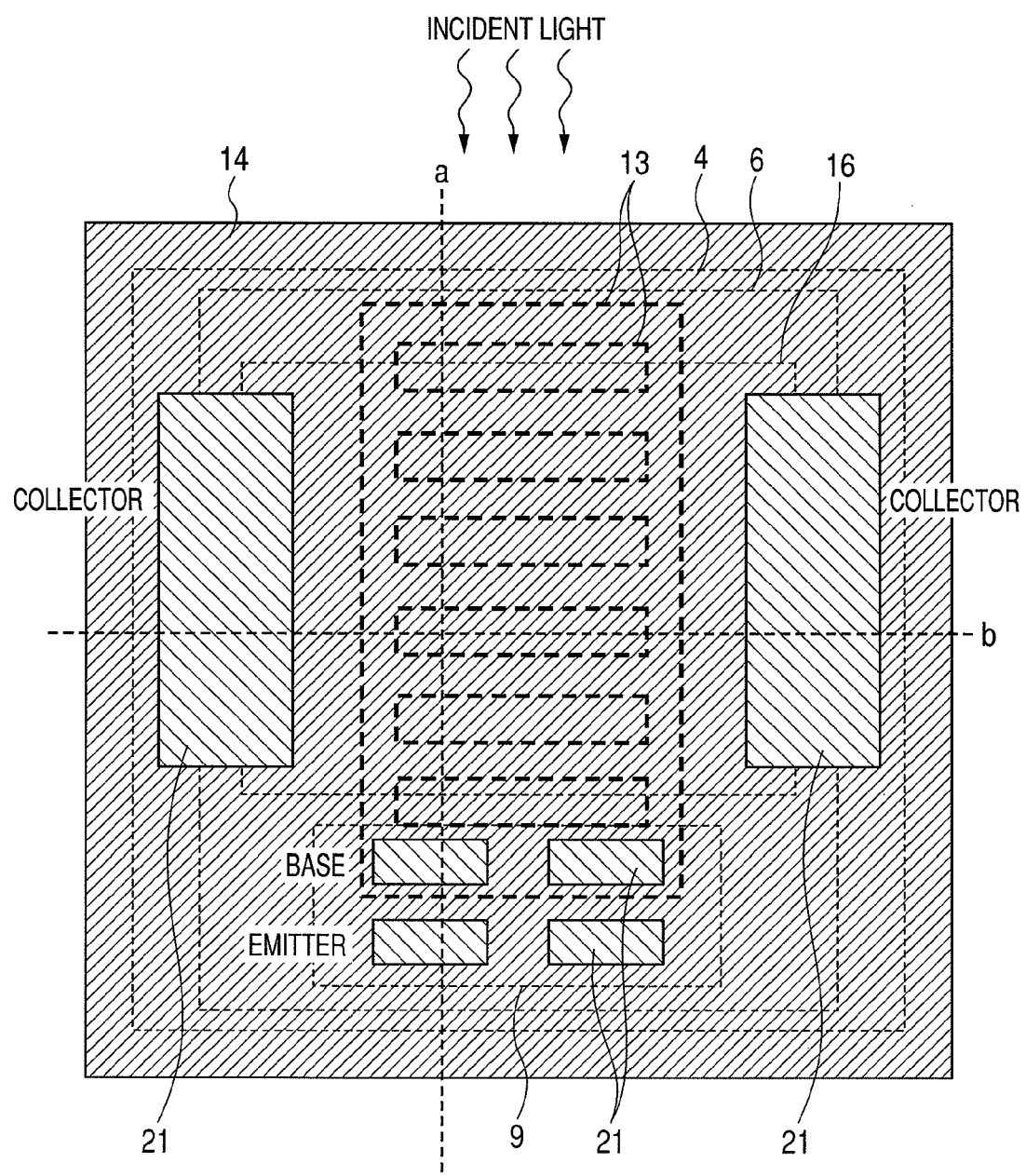
Figure 20:
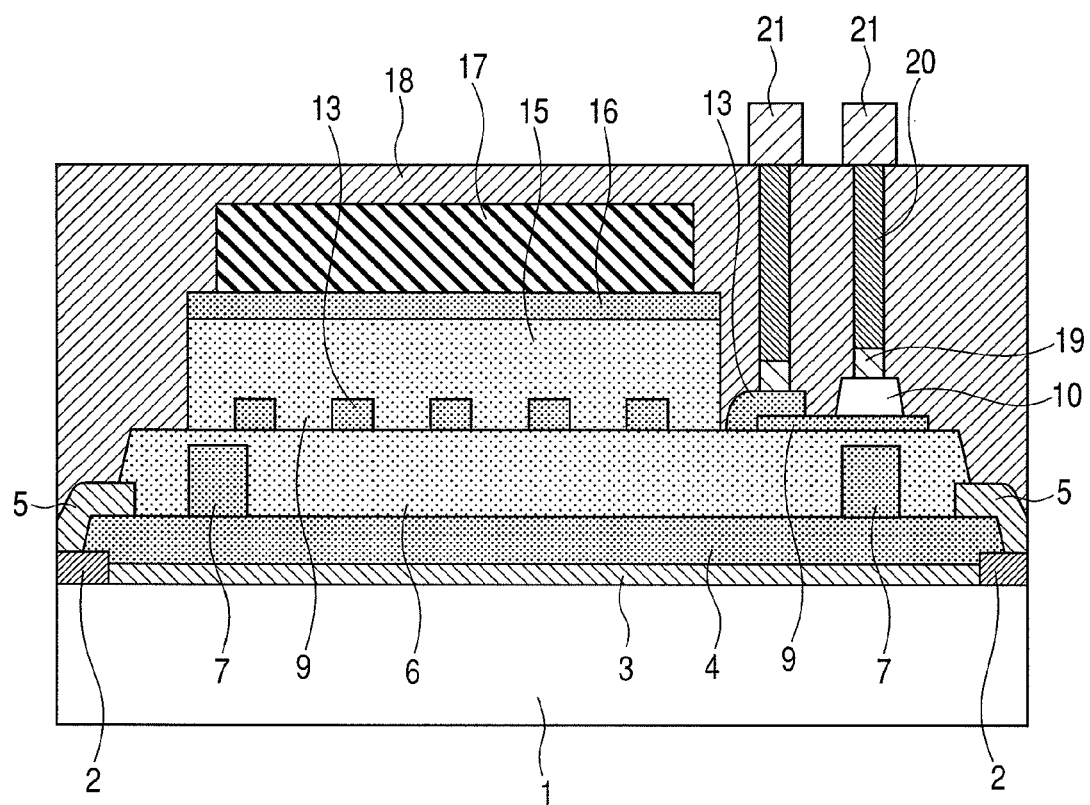
Figure 21:
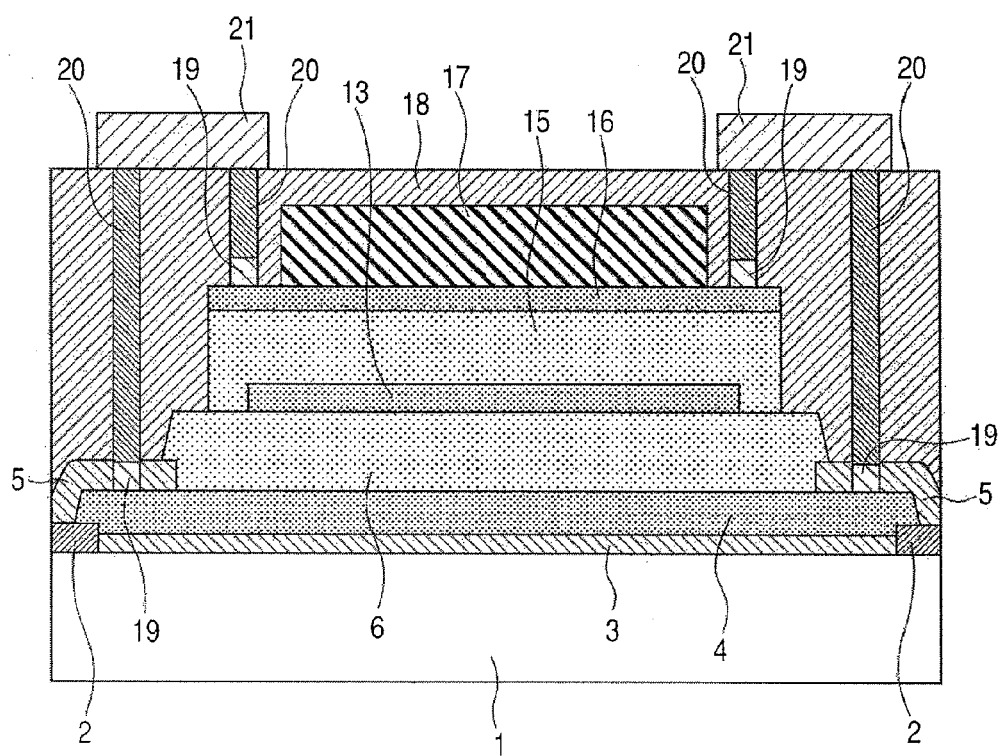

FI. 7D is a cross sectional view showing a method of manufacturing a semiconductor photodiode in the first embodiment orderly;

FIG. 7E is a cross sectional view showing a method of manufacturing a semiconductor photodiode in the first embodiment orderly;

FIG. 7F is a cross sectional view showing a method of manufacturing a semiconductor photodiode in the first embodiment orderly;

FIG. 7G is a cross sectional view showing a method of manufacturing a semiconductor photodiode in the first embodiment orderly;

FIG. 7H is a cross sectional view showing a method of manufacturing a semiconductor photodiode in the first embodiment orderly;

FIG. 7I is a cross sectional view showing a method of manufacturing a semiconductor photodiode in the first embodiment orderly;

FIG. 8A is a cross sectional view showing a method of manufacturing a semiconductor photodiode in a second embodiment orderly;

FIG. 8B is a cross sectional view showing a method of manufacturing a semiconductor photodiode in the second embodiment orderly;

FIG. 8C is a cross sectional view showing a method of manufacturing a semiconductor photodiode in the second embodiment orderly;

FIG. 8D is a cross sectional view showing a method of manufacturing a semiconductor photodiode in the second embodiment orderly;

FIG. 9A is a cross sectional view showing a method of manufacturing a semiconductor photodiode in a third embodiment orderly;

FIG. 9B is a cross sectional view showing a method of manufacturing a semiconductor photodiode in the third embodiment orderly;

FIG. 9C is a cross sectional view showing a method of manufacturing a semiconductor photodiode in the third embodiment orderly;

FIG. 9D is a cross sectional view showing a method of manufacturing a semiconductor photodiode in the third embodiment orderly;

FIG. 9E is a cross sectional view showing a method of manufacturing a semiconductor photodiode in the third embodiment orderly;

FIG. 9F is a cross sectional view showing a method of manufacturing a semiconductor photodiode in the third embodiment orderly;

FIG. 9G is a cross sectional view showing a method of manufacturing a semiconductor photodiode in the third embodiment orderly;

FIG. 9H is a cross sectional view showing a method of manufacturing a semiconductor photodiode in the third embodiment orderly;

FIG. 9I is a cross sectional view showing a method of manufacturing a semiconductor photodiode in the third embodiment orderly;

FIG. 10 is a plan view showing a method of manufacturing a semiconductor photodiode in a third embodiment;

FIG. 11 is a cross sectional view showing a method of manufacturing a semiconductor photodiode in the third embodiment;

FIG. 12 is a plan view showing a semiconductor photodiode in the third embodiment;

FIG. 13 is a graph showing a correlation between a cutoff frequency and a current density in the third embodiment:

FIG. 14A is a cross sectional view showing a method of manufacturing a semiconductor photodiode in a fourth embodiment orderly;

FIG. 14B is a cross sectional view showing a method of manufacturing a semiconductor photodiode in the fourth embodiment orderly;

FIG. 14C is a cross sectional view showing a method of manufacturing a semiconductor photodiode in the fourth embodiment orderly;

FIG. 14D is a cross sectional view showing a method of manufacturing a semiconductor photodiode in the fourth embodiment orderly;

FIG. 15A is a cross sectional view showing a method of manufacturing a semiconductor photodiode in the fourth embodiment orderly;

FIG. 15B is a cross sectional view showing a method of manufacturing a semiconductor photodiode in the fourth embodiment orderly;

FIG. 15C is a cross sectional view showing a method of manufacturing a semiconductor photodiode in the fourth embodiment orderly;

FIG. 15D is a cross sectional view showing a method of manufacturing a semiconductor photodiode in the fourth embodiment orderly;

FIG. 16 is a plan view showing a method of manufacturing a semiconductor photodiode in the fourth embodiment orderly;

FIG. 17A is a plan view showing a method of manufacturing a semiconductor photodiode in a fifth embodiment orderly;

FIG. 17B is a plan view showing a method of manufacturing a semiconductor photodiode in the fifth embodiment orderly;

FIG. 18A is a plan view showing a method of manufacturing a semiconductor photodiode in a sixth embodiment orderly;

FIG. 18B is a plan view showing a method of manufacturing a semiconductor photodiode in the sixth embodiment orderly;

FIG. 19 is a plan view showing a semiconductor photodiode in a seventh embodiment;

FIG. 20 is a cross sectional view showing a semiconductor photodiode in the seventh embodiment; and FIG. 21 is a cross sectional view showing a semiconductor photodiode in the seventh embodiment.

DETAILED DESCRIPTION OF THE PREFERRED EMBODIMENTS

For addressing the subjects described above, the present invention has characteristic features shown below.

A semiconductor photodiode according to an exemplary embodiment of the invention includes: a semiconductor substrate; a first conduction type first semiconductor layer formed above the semiconductor substrate; a second semiconductor layer of high resistance formed above the first semiconductor layer; a first conduction type third semiconductor layer formed above the second semiconductor layer; and a second conduction type fourth semiconductor layer buried in the second semiconductor layer, in which the fourth semiconductor layer is separated at a predetermined distance in the horizontal direction on the surface of the semiconductor substrate.

Further, it is preferred that the first semiconductor layer and the third semiconductor layer are at an electrically identical potential.

Further, in a case where the photodiode device is a surface photoreceiving type, it is preferred that the fourth semiconductor layer is separated at a distance of one-half or less of a light penetration length.

In a case where the photodiode device is a waveguide type, it is preferred that the fourth semiconductor layer is separated at a distance of one-half or less for the thickness of the second semiconductor layer.

The fourth semiconductor layer preferably has a band-like stripe structure.

It is also effective that the fourth semiconductor layer has a lattice-like periodical structure.

Further, the semiconductor photodiode device according an exemplary embodiment of the invention preferably includes a transistor having a current amplification function further in addition to the photoreceiving portion.

Further, it is preferred that the transistor is a bipolar transistor and the fourth semiconductor layer serves also as the base of the bipolar transistor.

Further it is more preferred that the first semiconductor layer also serves as a collector of the bipolar transistor.

Alternatively, it is preferred that the first semiconductor layer also serves as the base of the bipolar transistor.

It is effective that the semiconductor substrate comprises silicon, the first to fourth semiconductor layers comprise each single-crystal germanium or single-crystal silicon-germanium, and the emitter of the bipolar transistor comprises single-crystal silicon germanium or single-crystal silicon.

A method of manufacturing a semiconductor photodiode device according to an exemplary embodiment of the invention includes the steps of: epitaxially growing a first conduction type first semiconductor layer above a semiconductor substrate; epitaxially growing a high resistance second semiconductor layer above the first semiconductor layer; applying patterning with an insulating film above the second semiconductor layer and epitaxially growing a second conduction type fourth semiconductor layer selectively; etching to remove the insulating film; epitaxially growing the second semiconductor layer again above the fourth semiconductor layer; and epitaxially growing the a first conduction type third semiconductor layer above the second semiconductor layer.

Further, it is preferred that the first semiconductor layer and the third semiconductor layer are connected by a metal electrode.

Further, it is preferred that the collector of the bipolar transistor is formed simultaneously upon epitaxial growing of the first semiconductor layer.

Further, it is more preferred that the base of the bipolar transistor is formed simultaneously upon epitaxial growing of the fourth semiconductor layer.

Alternatively, the base of the bipolar transistor may also be formed simultaneously with epitaxial growing of the first semiconductor layer.

According to the semiconductor photodiode device and the manufacturing method thereof of exemplary embodiments of the invention, it is possible to provide a bipolar phototransistor having a photoreceiving portion capable of decreasing the capacitance while sufficiently keeping the area of the photoreceiving portion and further shortening the running time of carriers generated by light absorption.

Preferred embodiments of the invention are to be described specifically with reference to the drawings. Throughout the drawings for explaining the embodiments, those members having identical functions carry same reference numerals for which duplicate descriptions are to be omitted. It will be apparent that various modifications are possible such as alteration of materials and combination of manufacturing steps in addition to the method disclosed in the embodiments.

Specific embodiments are to be described below. Figures described in the drawings are not always conformed to exact size reduction but they are schematically shown while emphasizing important portions so as to make the explanation clearer.

First Embodiment

Figure 1:
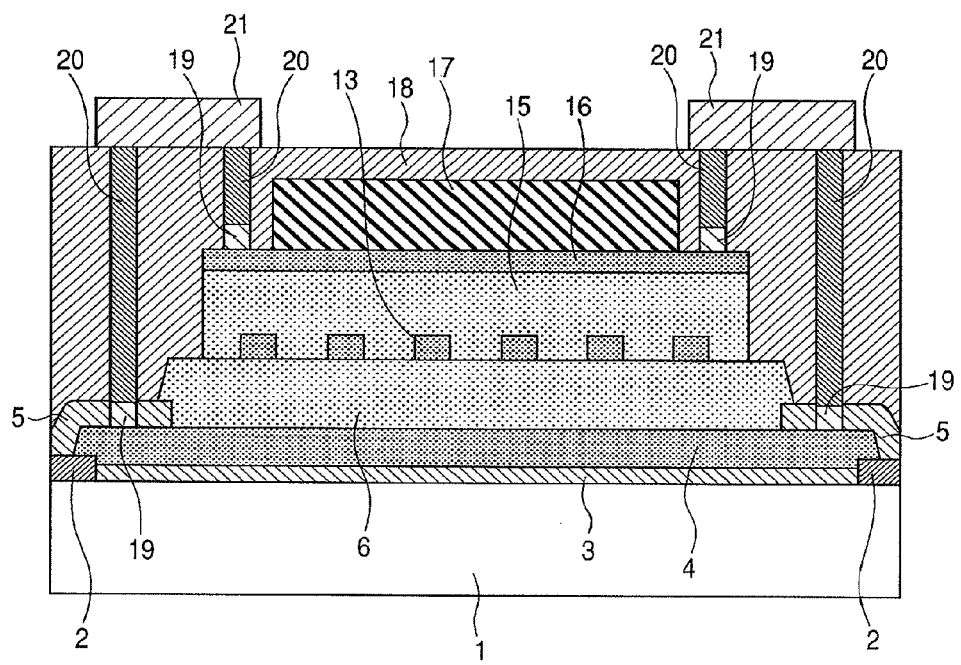
FIG. 1 is a cross sectional view showing a first embodiment of a semiconductor photodiode device according to the invention.
Figure 2A:
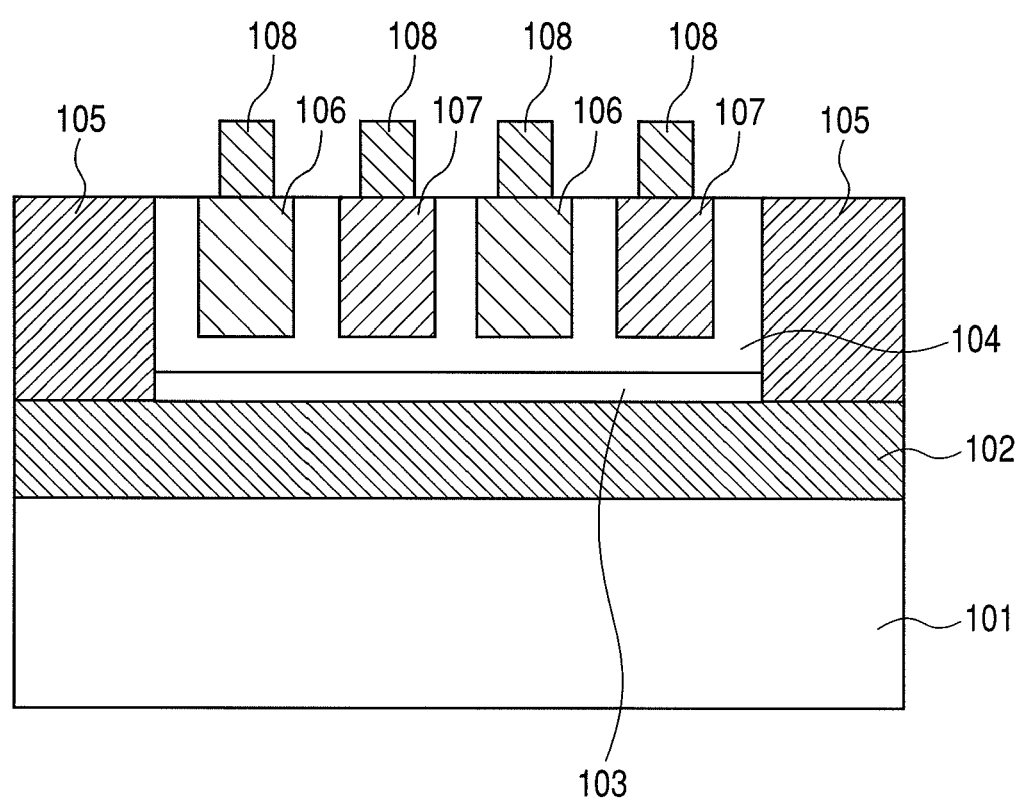
FIG. 2A is a cross sectional view showing a semiconductor photodiode device of an existent example 1.
Figure 2B:
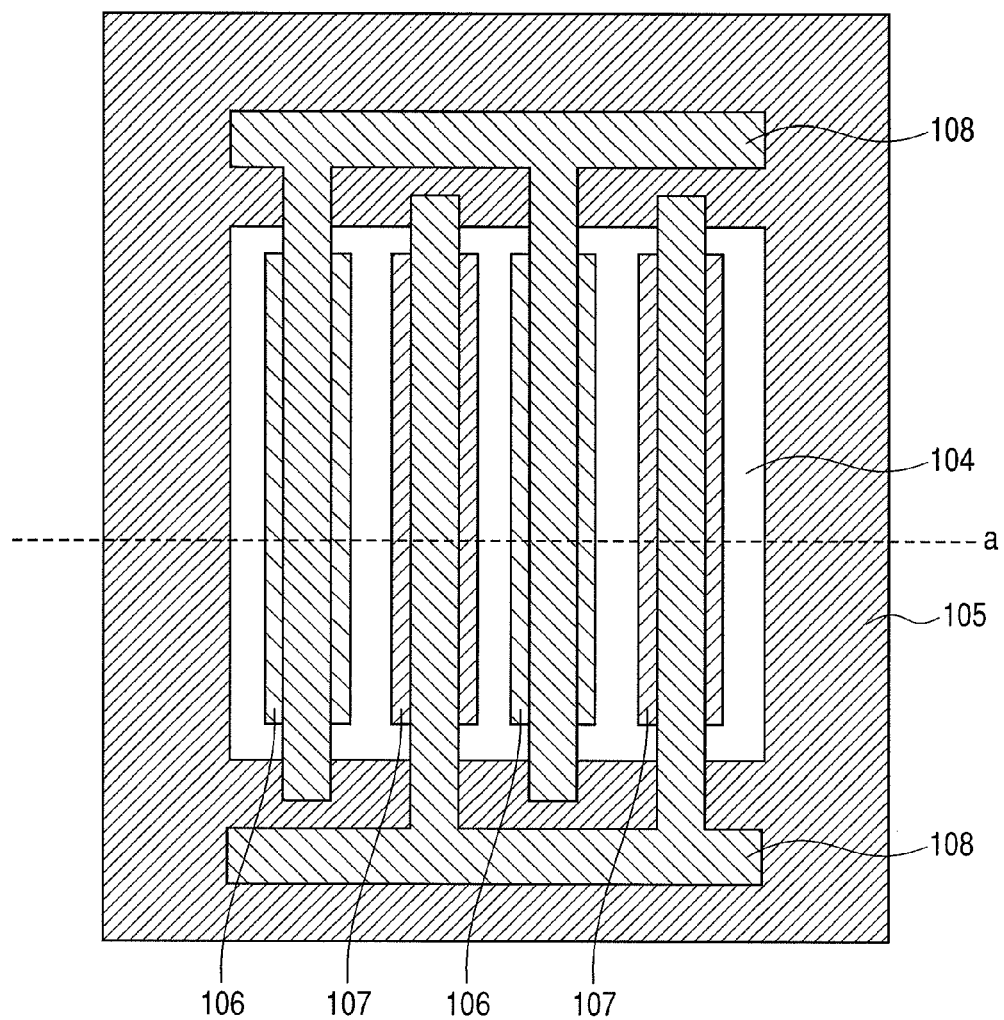
FIG. 2B is a plan view showing a semiconductor photodiode device of the existent example 1.
Figure 3:
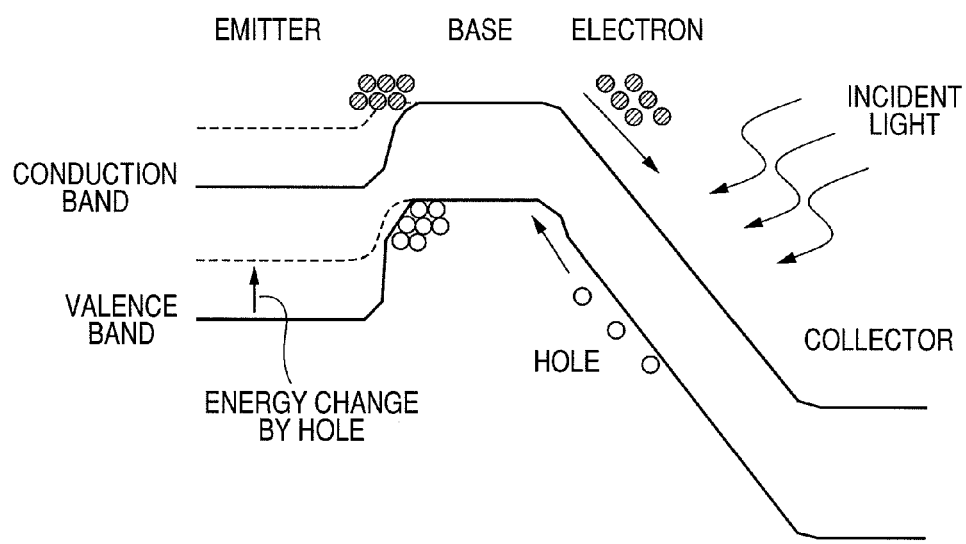
FIG. 3 is a schematic view showing the operation principle of a bipolar phototransistor.
Figure 4:
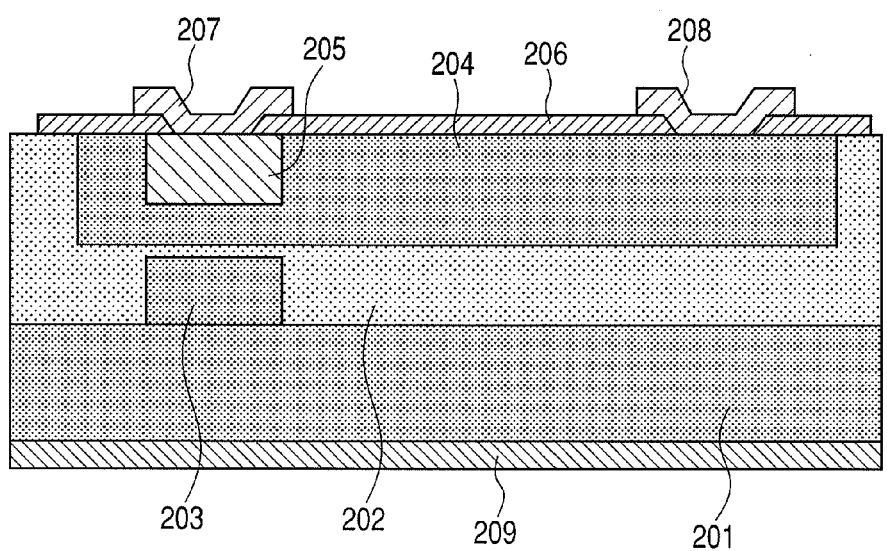
FIG. 4 is a cross sectional view showing a semiconductor photodiode device of an existent example 2.

FIG. 1 is a cross sectional view showing a first embodiment of a semiconductor photodiode device according to the invention. This cross sectional structure shows a cross section of a photoreceiving portion in a bipolar phototransistor having a photoreceiving portion and an amplification portion separately.

FIG. 1 shows a silicon substrate 1 and an insulating film 2 having a trench. Above the insulation film 2, an n-type Ge layer 4 is formed by way of a buffer layer 3 for improving the crystallinity of upper layers. A high resistance Ge layer 6 is formed within the trench formed with an insulating film 5 above the Ge layer 4, and a p-type Ge layer 13 divided at a predetermine distance in the direction horizontal to the substrate and a high resistance Ge layer 15 are formed in the layer thereabove. An n-type Ge layer 16 is formed above the high resistance Ge layer 15. A silicon nitride film ($Si_3N_4$) 17 and an interlayer insulating film 18 are also shown. Metal electrode 19 to 21 comprising titanium nitride (TiN), tungsten (W), and aluminum (Al) respectively are shown and are connected with the n-type Ge layer 4 and the n-type Ge layer 16, and the two layers are electrically connected by identical Al 21. As to be described later, the metal electrodes are connected also to the p-type Ge layer 13, and a voltage can be applied between the n-type Ge layers 4 and 16.

The structural feature in FIG. 1 is that the p-type Ge layer 13 is put between the n-type Ge layers 4 and 16, and the p-type Ge layer 13 is divided at a predetermined distance in the direction parallel to the substrate. A light incident to the photodiode in FIG. 1 is absorbed between the depleted high resistance layers 6 and 15 and converted into electron-hole pairs. Since a backward bias is applied between the p-type Ge layer 13 and the n-type Ge layers 4, 16, electrons are taken into the n-type Ge layers 4, 16 and the holes are taken into the p-type Ge layer 13. Considering a case where the light is absorbed at all positions of the high resistance Ge layers 6 and 15 in the direction perpendicular to the substrate, that is, a case in which the thickness of the absorption layer is shorter than the light absorption length in a surface photoreceiving type photodiode or a case of a waveguide type photodiode in which the light is incident from the side wall and assuming that the distance between each of the p-type Ge layers 13 divided in the horizontal direction to each other is identical with the thickness of the entire high resistance layer or less in which the light is absorbed, the distance between the holes generated at any site in the high resistance Ge layers 6, 15 and the p-type Ge layer 13 is decreased to one-half or less of the total thickness for the high resistance Ge layers 6 and 15. The same effect is obtained also to the electrons, in which the distance between the electrons generated at any site in the high resistance Ge layers 6 and 15 and the n-type Ge layer 4 or 16 is one-half or less of the total thickness for the high resistance Ge layers 6 and 15. This suggests that the carrier running time can be shortened remarkably compared with the case of a p-i-n type photodiode having a thickness equal with the total thickness for the high resistance Ge layers 6 and 15. Further, the photodiode shown in FIG. 1 has a structure capable of decreasing the inter p/n capacitance while keeping the area of the photoreceiving portion constant by dividing the p-type Ge layer 13. Since the inter p/n capacitance is determined depending on the area where the p-type Ge layer 13 overlaps with the n-type Ge layers 4 and 16, the capacitance can be decreased more as the width of the p-type Ge layer 13 is decreased. While the lower limit for the width of the p-type Ge layer 13 is restricted by deterioration of the high speed operation caused by the increase of the resistance of the p-type Ge layer 13, the width and the height of the p-type Ge layer 13 can be decreased to about 0.3 μm also in a case where the diameter of the photodiode is 30 μm. Assuming the total thickness for the high resistance layers as 2 μm, and defining the distance and the width of the p-type Ge layer 13 as 2 μm and 0.3 μm, respectively, the capacitance can be decreased to about ⅓ compared with a p-i-n photodiode having a light absorption layer of 2 μm thickness. As described above, capacitance can be decreased and the carrier running type can be shortened while keeping the photoreceiving area and the thickness of the light absorption layer sufficiently by burying the p-type Ge layer 13 in the high resistance layer and, further, dividing the same in a direction horizontal to the substrate, whereby the high speed performance and the high efficiency performance of the photodiode can be made compatible. In the example described above, description has been made only to a case where the thickness of the absorbing layer is shorter than the light absorption length of the surface photoreceiving type photodiode, or to a case of the waveguide type photodiode, the same effect can be obtained also in a case of the surface photoreceiving type photodiode in which the thickness of the absorption layer is larger than the light absorption length. In this case, the distance between the p-type Ge layers may be made about identical with the light absorption length. This can prevent increase in the running time of carriers even when the absorption layer is thick, and the running time of holes generated in the light absorption region can be shortened effectively.

Then, a concrete method of manufacturing a semiconductor photodiode device of this embodiment is to be described specifically with reference to FIG. 5A to FIG. 5I, FIG. 6A to FIG. 6I, and FIG. 7A to FIG. 7I. FIG. 5A to FIG. 5I show cross sectional views of a device including an amplification portion and a photoreceiving portion, FIG. 6A to FIG. 6I show cross sectional views only for the photoreceiving portion as viewed from the direction of 90 degree relative to FIG. 5A to FIG. 6I, and FIG. 7A to FIG. 7I show schematic views of the photodiode as viewed from the surface of the substrate. FIG. 7A to FIG. 7I show the positions of cross section along a line a and a line b, in which FIG. 5A to FIG. 5I are cross sectional views along line b, and FIG. 6A to FIG. 6I are cross sectional views along line a.

Figure 5A:
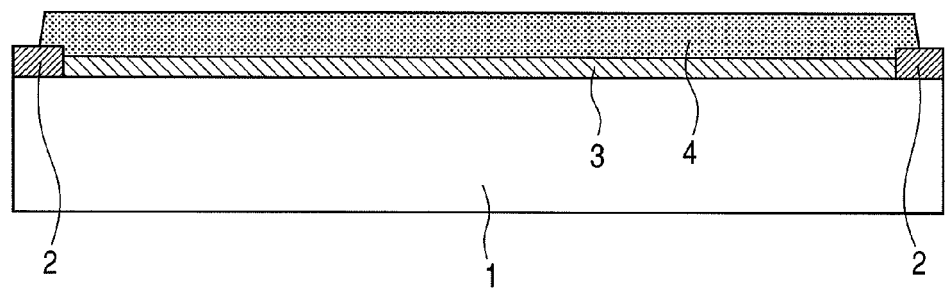
FIG. 5A is a cross sectional view showing a method of manufacturing a semiconductor photodiode in a first embodiment orderly.
Figure 5B:
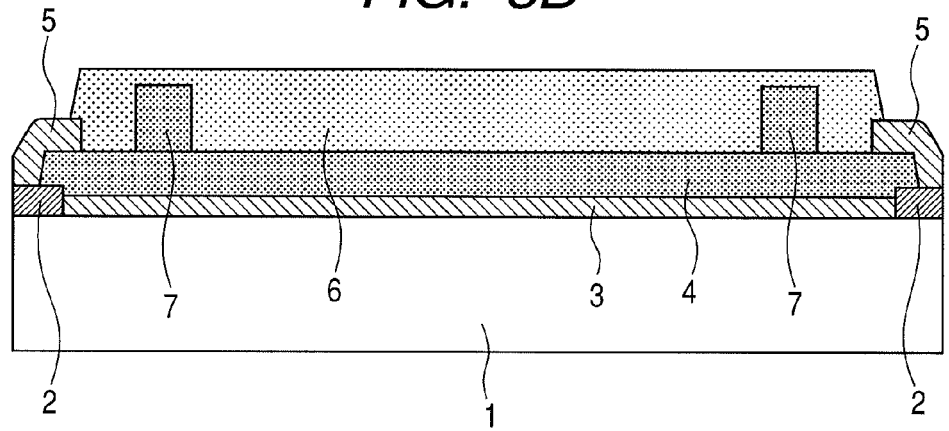
FIG. 5B is a cross sectional view showing a method of manufacturing a semiconductor photodiode in the first embodiment orderly.
Figure 5C:
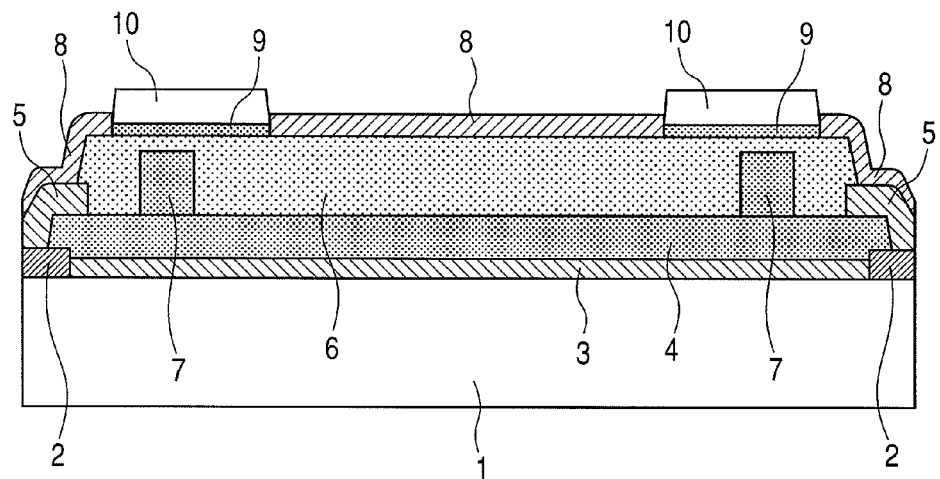
FIG. 5C is a cross sectional view showing a method of manufacturing a semiconductor photodiode in the first embodiment orderly.
Figure 6A:
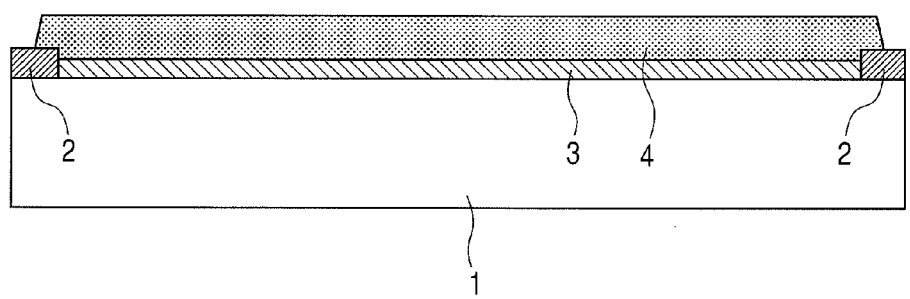
FIG. 6A is a cross sectional view showing a method of manufacturing a semiconductor photodiode in the first embodiment orderly.
Figure 6B:
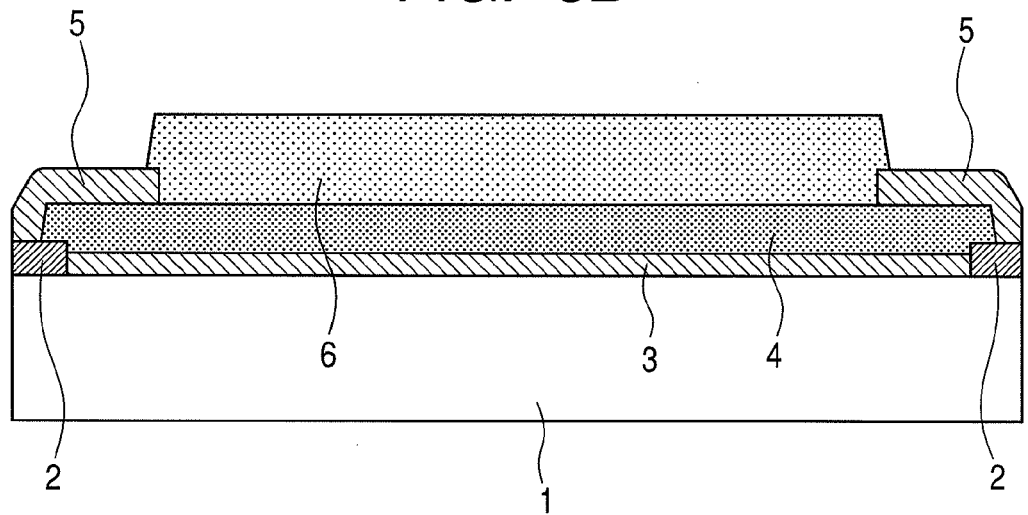
FIG. 6B is a cross sectional view showing a method of manufacturing a semiconductor photodiode in the first embodiment orderly.
Figure 6C:
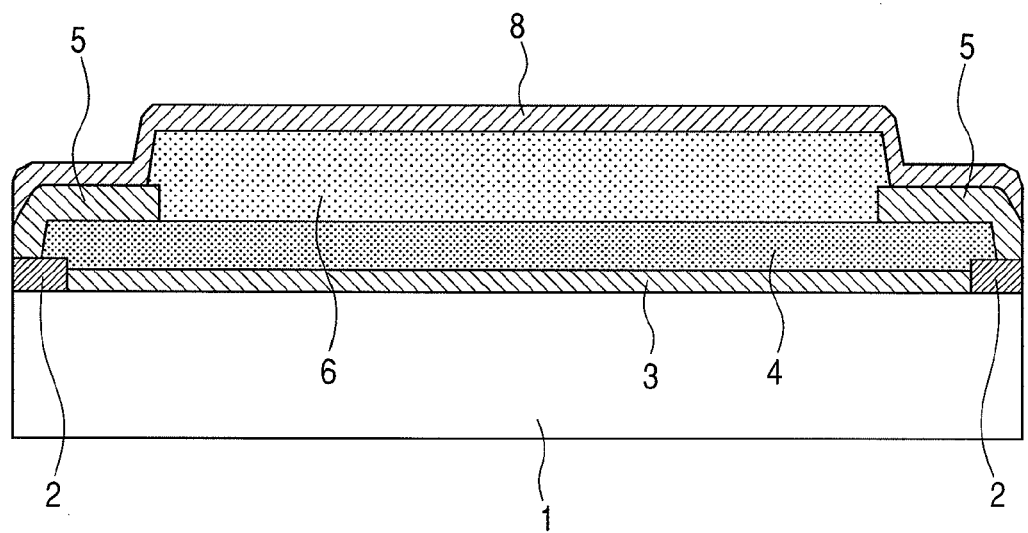
FIG. 6C is a cross sectional view showing a method of manufacturing a semiconductor photodiode in the first embodiment orderly.

At first, as shown in FIG. 5A, FIG. 6A, and FIG. 7A, an insulating film 2 is deposited above an Si substrate 1 and a trench is formed by wet etching or dry etching. For example, a silicon oxide film ($SiO_2$) may be used for the insulating film in which hydrofluoric acid (HF) diluted to 0.5% may be used for wet etching. In a case of dry etching, fabrication is made by using an etching gas containing a fluoro compound. A buffer layer 3 and an n-type Ge layer 4 are formed successively within the trench by epitaxial growing using, for example, a gas source molecular beam epitaxy (MBE) method, a chemical vapor deposition (CVD) method, etc. The buffer layer 3 is formed by epitaxially growing Si, silicon-germanium (SiGe), or Ge by about 30 nm at a low temperature of about 350° C. Monosilane ($SiH_4$) or disilane ($Si_2H_6$) is used as an Si starting material gas, and germane ($GeH_4$) is used as a Ge starting material gas. In this case, a number of dangling bonds not contributing to covalent bonds are generated in the buffer layer 3 grown at a low temperature and the crystal intensity of the buffer layer is weakened. Then, an n-type Ge layer 4 is epitaxially grown by 50 to 200 nm at a growing temperature of 550° C. to 650° C. Phosphorous (P) or arsenic (As) is suitable to the n-type impurity, and phosphine ($PH_3$) or arsine ($AsH_3$) diluted with hydrogen is used as the gas during growing. The impurity concentration in the n-type Ge layer 4 is adjusted to about $1\times10^{20}$ $cm^{-3}$ by controlling the gas flow rate to lower the resistance of the n-type Ge layer 4. In this process, epitaxial growing of the buffer layer 3 and the n-type Ge layer 4 is carried out under the condition where they are grown selectively to the oxide film only above the Si substrate. In a case of growing Ge, it can be grown selectively by about 3 μm or more in a wide pressure range from 1 Pa to 1,000 Pa so long as in the temperature range is described above. In the n-type Ge layer 4 after the growing, a number of defects generated upon moderation of the strain energy due to the difference of the lattice Constance between Si and Ge are present. Therefore, a heat treatment is applied after growing. The heat treatment is effective when it is carried out by ascending and descending the temperature between 900° C. and 780° C. by 10 times each for 10 min, during which defects present in the n-type Ge layer 4 are repaired to restore the crystallinity. Upon restoration of the crystallinity, while large strain energy is generated, the strain energy can be moderated by selectively generating defects only in the underlying buffer layer 3, and an n-type Ge layer 4 of good crystallinity can be obtained.

Then, an insulating film 5 is deposited above the n-type Ge layer 4 and the trench is patterned. An $SiO_2$ film may be used for the insulating film 5 as in the case of the insulating film 2 and the same method as described above can be adopted for the etching. Then, a high resistance Ge layer 6 is formed within the trench by selective epitaxial growth. In this case, it is preferred to define the impurity concentration in the Ge layer 6 to about $1\times10^{17}$ $cm^{-3}$ in order to deplete the Ge layer 6 sufficiently. A high concentration n-type region 7 is formed in the bipolar transistor forming region of the high resistance Ge layer 6 by ion implantation to obtain a structure shown in FIG. 5B, FIG. 6B, and FIG. 7B. P or As is used for the impurity upon ion implantation, and the impurity concentration of the high concentration n-type region 7 is defined about identical with that in the high concentration n-type impurity layer 4.

Successively, an insulating film 8 is deposited over the entire surface and a trench is formed in a bipolar transistor forming region. Then, a base layer 9 comprising p-type Ge and an emitter layer 10 comprising n-type Si—Ge or n-type Si is epitaxially grown continuously to obtain a structure shown in FIG. 5C, FIG. 6C, and FIG. 7C. Boron B using diborane ($B_2H_6$) as the starting gas is used for the impurity of the base layer 9 and the impurity concentration is defined to about $1\times10^{20}$ $cm^{-3}$. While the operation speed of the bipolar transistor can be made higher as the base layer 9 is thinner, the thickness is defined as 5 nm to 10 nm considering the suppression for the increase of the base resistance. The thickness of the emitter layer 10 is defined as about 50 nm to 100 nm, and P or As is added as the impurity by about $1\times10^{20}$ $cm^{-3}$. However, since emitter/base junction at high concentration causes generation of leak current, growing is carried out preferably at a low concentration of about $2\times10^{18}$ $cm^{-3}$ for 10 to 20 nm after starting the emitter growing. In this process, the hetero effect increases more as the Si compositional ratio of the emitter layer 10 increases and the current amplification factor can be increased remarkably. However, along with increase of the Si composition, the amount of lattice mismatching with the Ge base layer 9 increase more to possibly generate defects due to strain energy moderation at a predetermined thickness or more. Further, since the response speed to optical signals is lowered when the current amplification factor increase excessively, the compositional value has to be designed while considering process controllability and required necessary amplification performance.

Figure 5D:
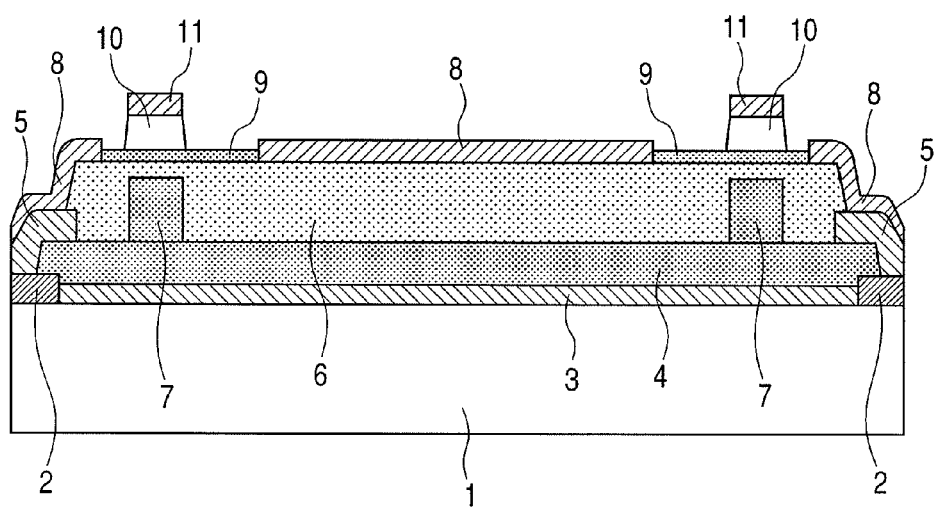
FIG. 5D is a cross sectional view showing a method of manufacturing a semiconductor photodiode in the first embodiment orderly.
Figure 6D:
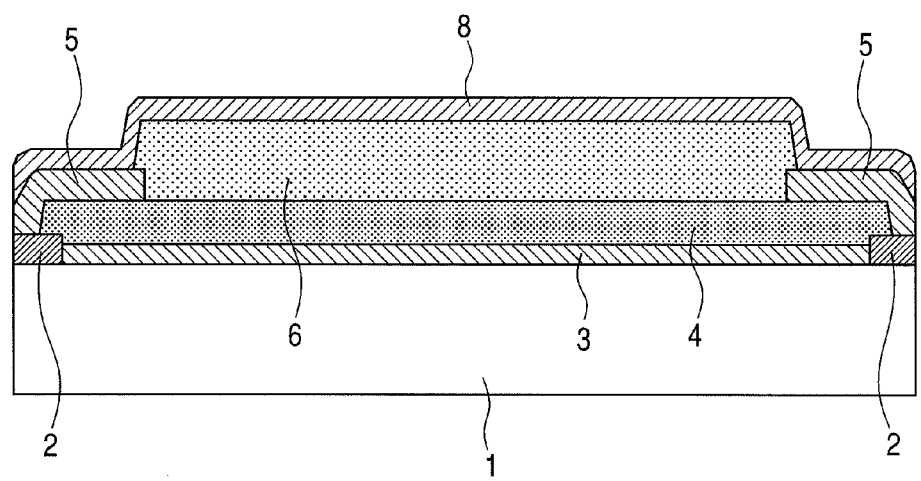
FIG. 6D is a cross sectional view showing a method of manufacturing a semiconductor photodiode in the first embodiment orderly.

Then, an insulating film 11 is deposited and the insulating film 11 is left only in the emitter forming region by patterning and the remaining portion is removed by etching. The type of the insulating film 11 and the etching method are as described above. Then, the emitter layer 10 is patterned by wet etching using the insulating film 11 as a mask to partially expose the base layer 9. When an alkaline etching solution is used for the wet etching, selective etching is possible while using the underlying base layer 9 as a stopper. Outline of the selective wet etching is shown below. For the etching solution, a strong alkaline solution such as an aqueous solution of potassium hydroxide (KOH) or an aqueous solution of tetramethyl ammonium hydroxide (TMAH) is used. In the etching by the strong alkaline solution, the etching rate for the high concentration p-type Si or SiGe is lower by about 1 digit compared with that for the n-type or low concentration Si (SiGe). Further, since the etching rate of SiGe is lower by about 1/100 to Si, the p-type Ge layer 9 has a sufficient function as the stopper layer to the n-type SiGe or Si layer 10. The shape after patterning the emitter region is in the structure as shown in FIG. 5D, FIG. 6D, and FIG. 7D.

Figure 5E:
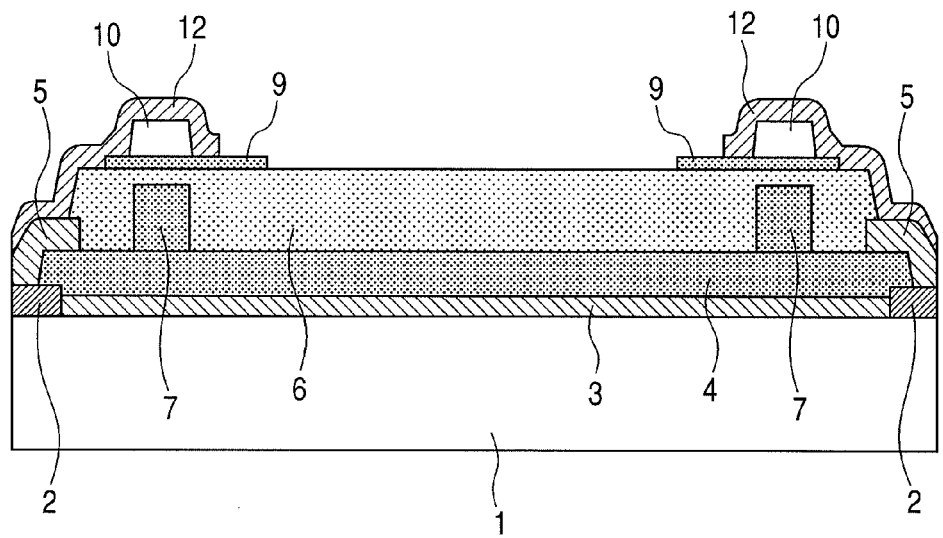
FIG. 5E is a cross sectional view showing a method of manufacturing a semiconductor photodiode in the first embodiment orderly.
Figure 6E:
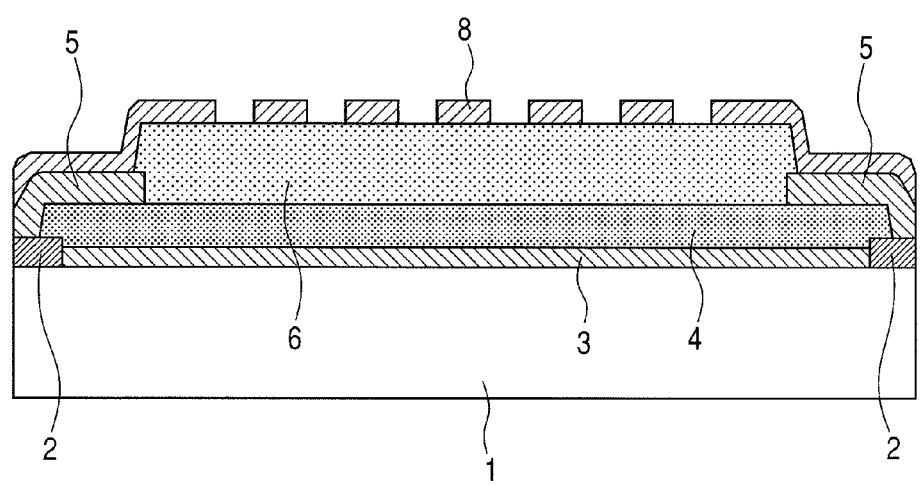
FIG. 6E is a cross sectional view showing a method of manufacturing a semiconductor photodiode in the first embodiment orderly.

Then, after removing the insulating film 11 and depositing the insulating film 12 over the entire surface, a region for forming the p-type Ge layer of the photoreceiving portion is patterned to fabricate the insulating film 12. The type of the insulating film 12 and the etching method are as has been described above. The structure after patterning is shown in FIG. 5E, FIG. 6E, and FIG. 7E. Patterning is carried out so as to expose the base layer 9 of the bipolar transistor as shown in FIG. 5E and carried out so as to form a comb-like shape in the direction perpendicular to the direction of arranging the bipolar transistors as shown in FIG. 6E. The width of the insulating film in FIG. 6E is decided depending on the total thickness of the light absorption layer or aimed light absorption length of Ge in the wavelength region. That is, in a case where the total thickness for the absorption layer is less than the light absorption length of Ge in a case of a surface photoreceiving type device or in a case of a waveguide type photodiode, it is preferred that the width of the insulating film is about at the aimed total thickness of the light absorption layer and, in a case where the total thickness of the absorption layer is larger than the Ge light absorption length in the surface photoreceiving type device, the width of the insulating film may be about identical with the light absorption length.

Figure 5F:
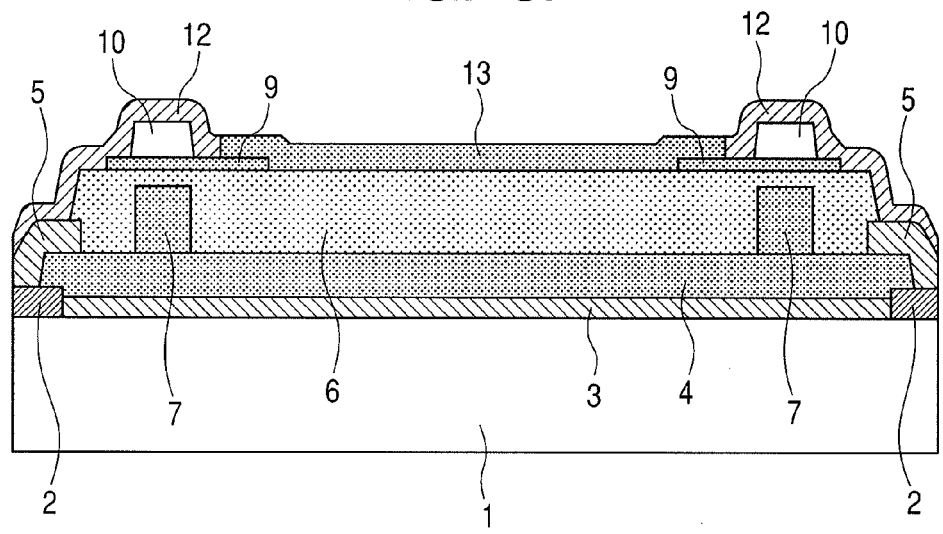
FIG. 5F is a cross sectional view showing a method of manufacturing a semiconductor photodiode in the first embodiment orderly.
Figure 6F:
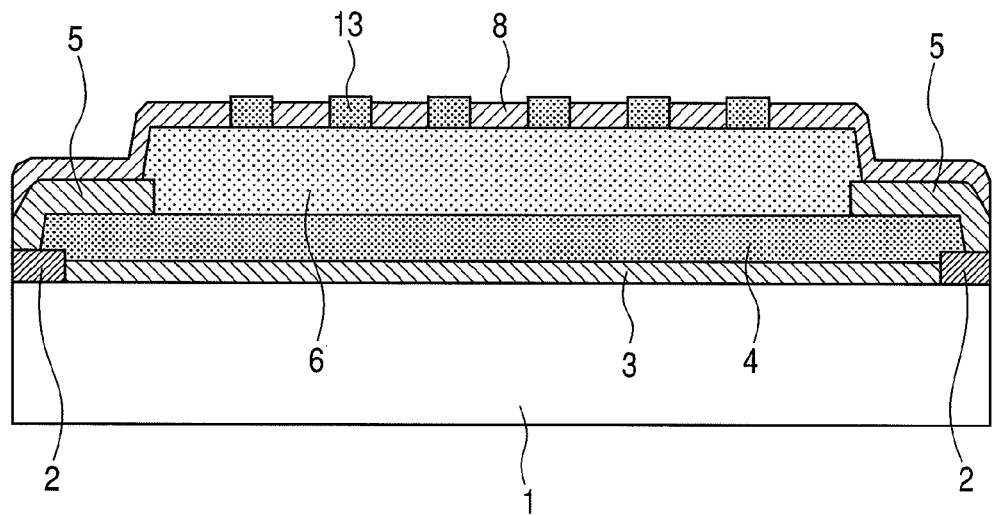
FIG. 6F is a cross sectional view showing a method of manufacturing a semiconductor photodiode in the first embodiment orderly.

Then, a p-type Ge layer 13 is grown selectively in the trench faulted with the insulating film 8 to obtain a structures shown in FIG. 5F, FIG. 6F, and FIG. 7F. B is used for the p-type impurity in the same manner as that for the base layer of the bipolar portion, and heavy doping is carried out. The thickness and the width of the Ge layer 13 are designed in view of the resistance value. As described above, when the impurity concentration is $1 \times 10^{20}$ cm$^{-3}$ in the surface photoreceiving type device of 30 μm diameter, when the thickness is defined as 0.3 μm, the width of the Ge layer 13 can be decreased to about 0.3 μm.

Figure 5G:
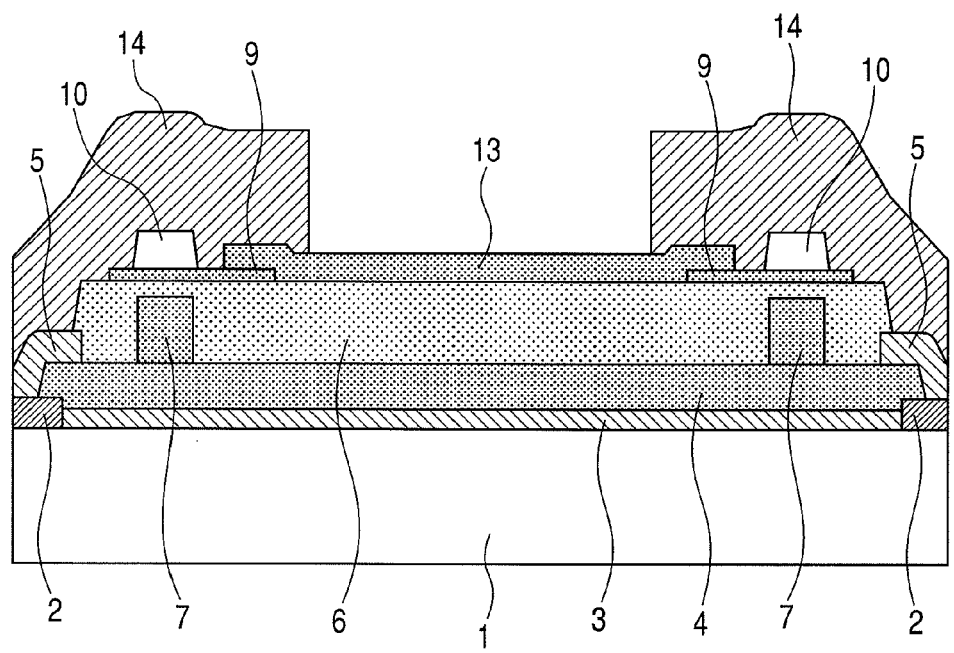
FIG. 5G is a cross sectional view showing a method of manufacturing a semiconductor photodiode in the first embodiment orderly.
Figure 6G:
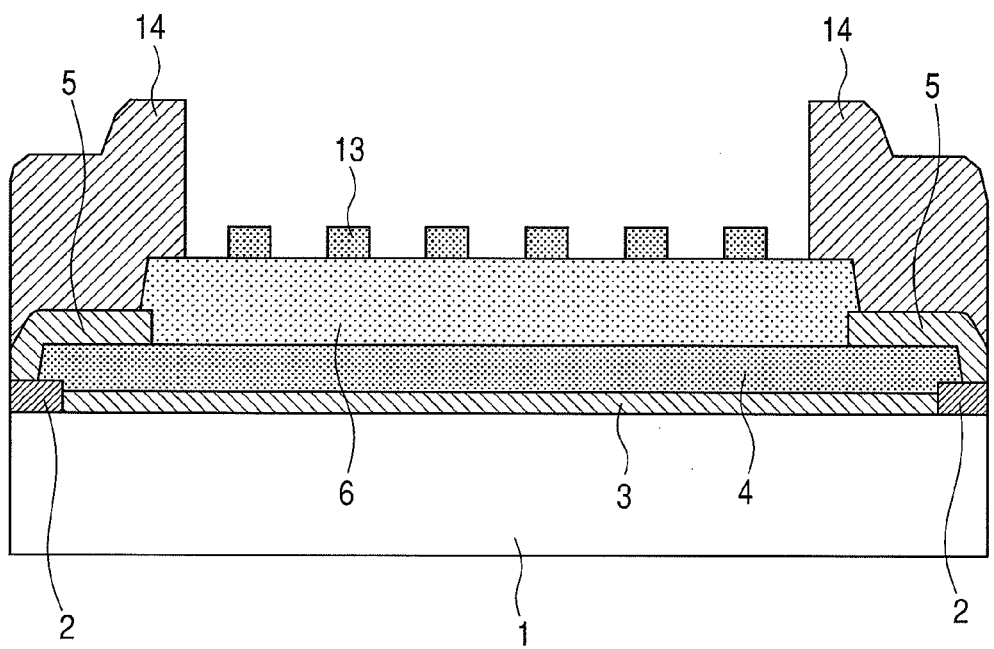
FIG. 6G is a cross sectional view showing a method of manufacturing a semiconductor photodiode in the first embodiment orderly.

After removing the insulating film 8 by weight etching, an insulating film 14 is deposited and, further, a region for forming a photoreceiving portion is patterned to remove the insulating film 14 by wet etching or dry etching. The type of the insulating film 14 and the etching method are as has been described above. Cross sectional views and plan views after this process are shown in FIG. 5G, FIG. 6G, and FIG. 7G. The insulating film 14 is an insulating film used as a mask upon forming a high resistance layer formed above in the photoreceiving portion and it is necessary that the film has a thickness equal with or more than that of the sum of the thickness of the high resistance layer and that for the n-type Ge layer as the upper layer. Accordingly, the thickness of the insulating film 14 is designed in view of the necessary thickness of the light absorption layer. The thickness of the high resistance layer in the photoreceiving portion is to be described in the explanation for the next step.

Figure 5H:
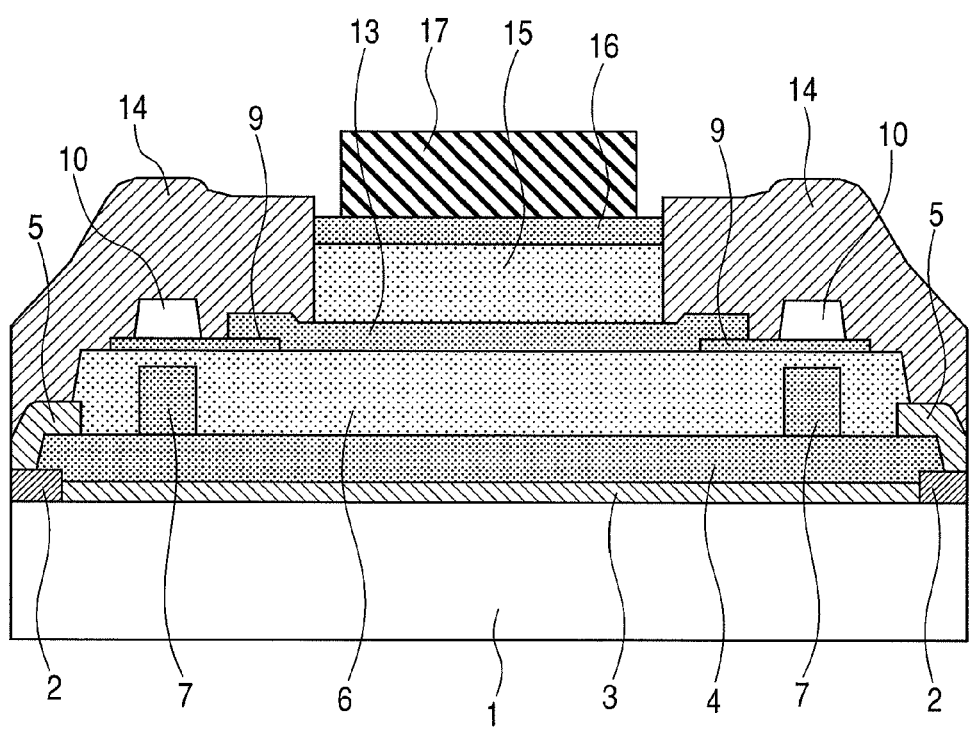
FIG. 5H is a cross sectional view showing a method of manufacturing a semiconductor photodiode in the first embodiment orderly.
Figure 6H:
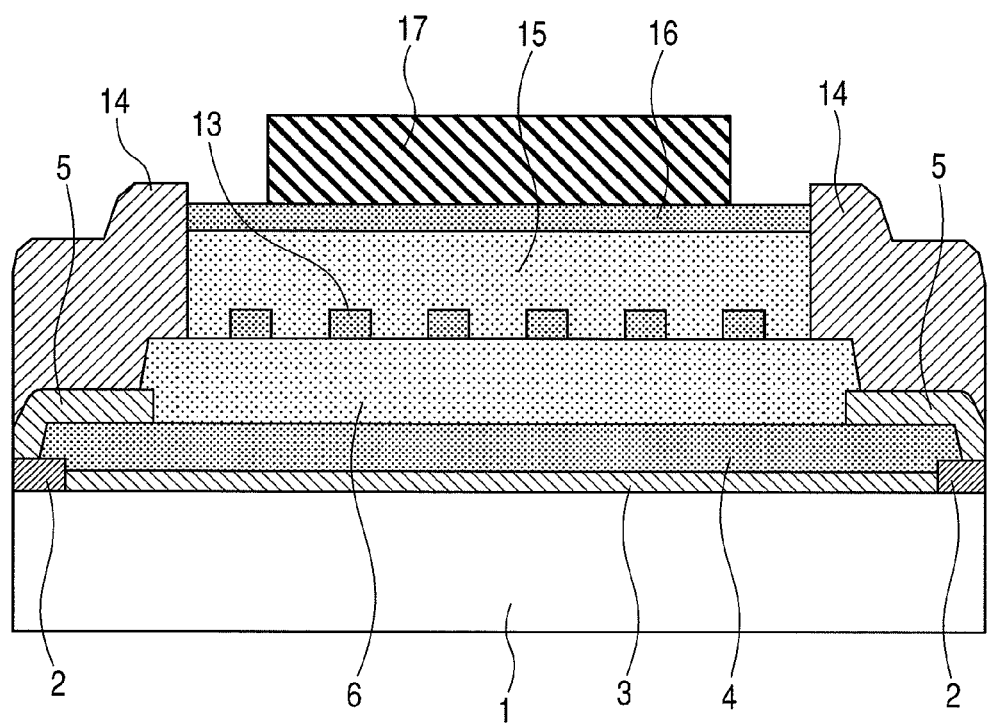
FIG. 6H is a cross sectional view showing a method of manufacturing a semiconductor photodiode in the first embodiment orderly.

A high resistance Ge layer 15 and an n-type impurity layer 16 are selectively grown continuously within the trench formed with the insulating film 14. The impurity concentration of the high resistance layer 15 is made identical with that of the high resistance layer 6. The thickness of the high resistance layer 15 is defined as described below in view of the aimed device structure and the wave length band region to be used. In a case when the thickness of the light absorption layer 15 is less than that of the Ge light absorption length in a surface photoreceiving type device or in a case of the waveguide type photodiode, it is designed such that the p-type Ge layer 13 is disposed at the center of the light absorption layer. That is, the thickness of the high resistance layer 15 may be about identical with that of the high resistance layer 6. On the other hand, when the thickness of the light absorption layer is identical with or larger than the Ge light absorption length in the surface photoreceiving type device, the thickness of the high resistance layer 15 is made about one-half of the light absorption length in order to shorten the running distance of holes. For example, since the light absorption length of Ge is about 2 μm to a light at 1550 nm which is the wavelength band for long distance communication, when the thickness of the light absorption layer is made sufficiently thick in the surface photoreceiving type device, the thickness of the high resistance Ge layer 15 as the upper layer is about 1 μm. p or As is used as the impurity of the N-type Ge layer 16 as described above and the concentration is defined as about $1 \times 10^{20}$ cm$^-$. The thickness is preferably about 100 to 200 nm. Since light absorption property is deteriorated when the thickness of the n-type Ge layer 16 is excessively large, it should be noted. Among the electron-hole pairs generated by light absorption in the n-type Ge layer 16, electrons as major carriers do not attribute to the current, whereas holes transfer toward the depletion layer but the carrier speed is low since the electric field is weak in the n-type Ge layer 16. Accordingly, both efficiency and high speed property are poor for the light generated in the n-type Ge layer. After forming the n-type Ge layer 16, a silicon nitride film ($Si_3N_4$) 17 is deposited by about 800 nm and patterned above the photoreceiving portion. The $Si_3N_4$ film has an effect of applying 2-dimensional tensile stress on the Ge layer in the photoreceiving portion. It has been generally known that the bandgap of the Ge layer undergoing the tensile stress is decreased and the absorption efficiency to the light at a long wavelength is increased by deposition of $Si_3N_4$. Structures after patterning the $Si_3N_4$ layer are as shown in FIG. 5H, FIG. 6H, and FIG. 7H.

Figure 5I:
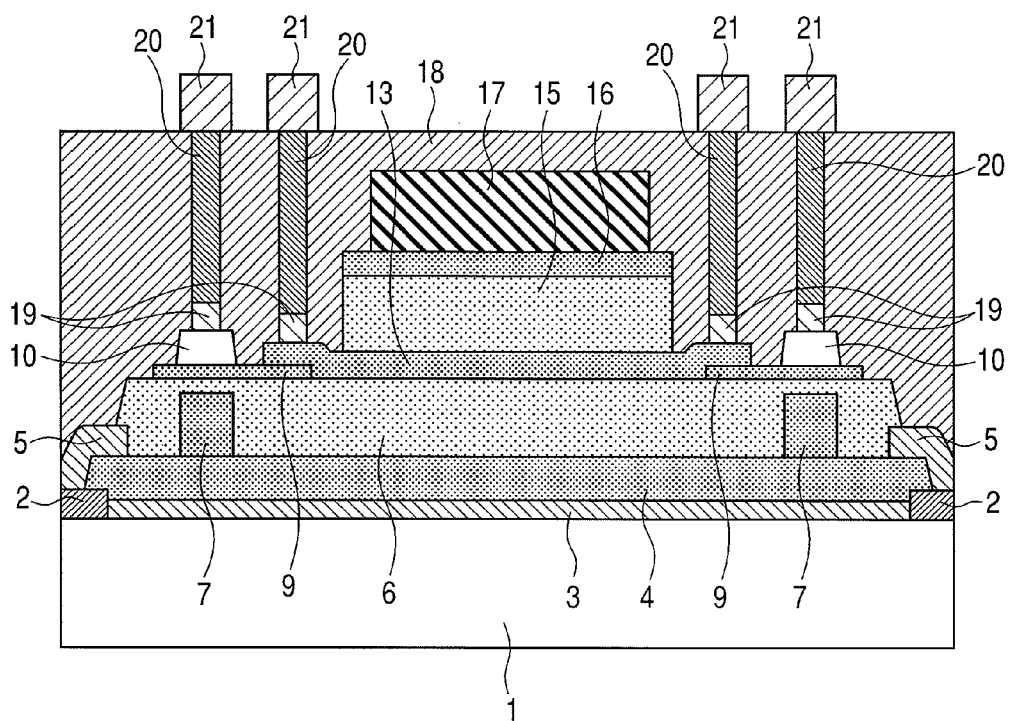
FIG. 5I is a cross sectional view showing a method of manufacturing a semiconductor photodiode in the first embodiment orderly.
Figure 6I:
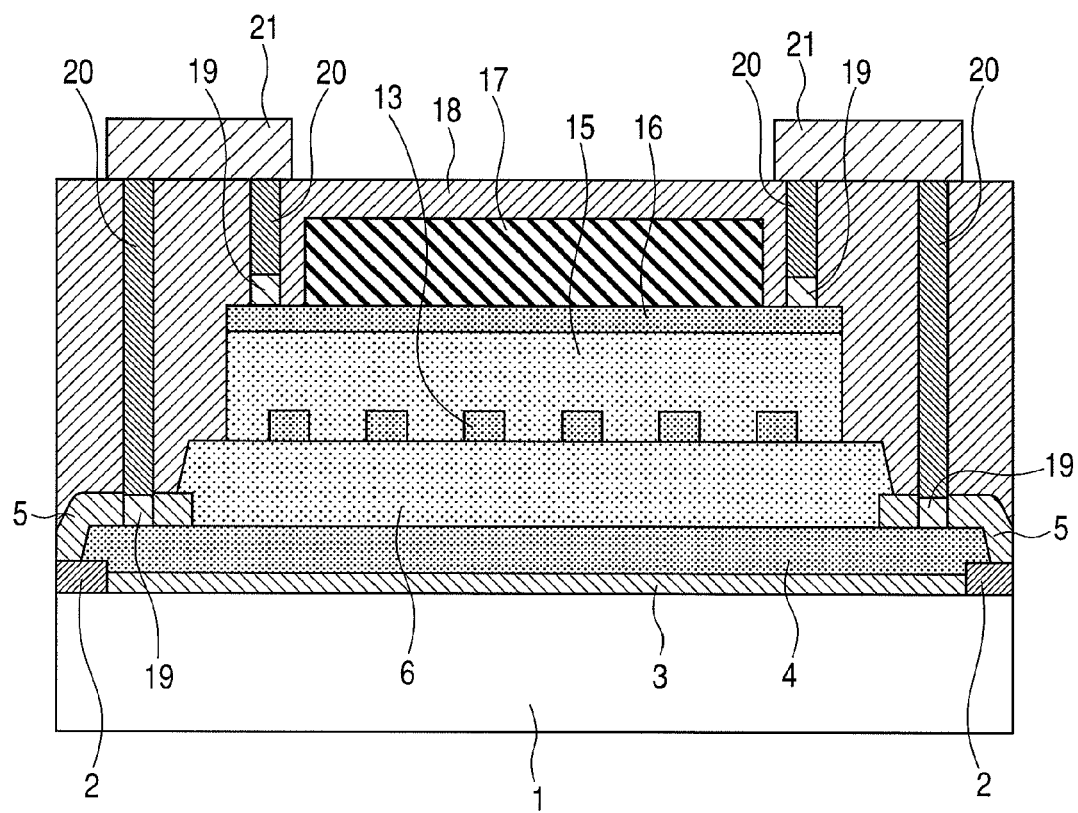
FIG. 6I is a cross sectional view showing a method of manufacturing a semiconductor photodiode in the first embodiment orderly.

Finally, after depositing an insulating film 18, the surface of the insulating film 18 is planarized by Chemical Mechanical Polishing (CMP), etc. and electrode forming regions above the p-type Ge layer 13 and the n-type Ge layers 4 and 16 of the photoreceiving portion and the emitter 10 of the bipolar transistor are opened by dry etching to form metal electrodes. The metal electrodes are formed by depositing a TiN layer 19 and a W plug 20 by a CVD method or the like thereby burying the trench, planarizing the surface by CMP or the like, depositing an Al layer 21 by a sputtering method or the like, and then patterning the same by dry etching or wet etching. In this case, the collector of the bipolar portion is in common with the n-type Ge layer 4 of the photoreceiving portion and the base thereof is in common with the p-type Ge layer 13 of the photoreceiving portion. Further, for efficiently improving the running time of carriers, the potential is made equal for the n-type Ge layer 4 and the n-type Ge layer 16 thereby making the electric field distribution equal above and below the p-type Ge layer 13 in the photoreceiving portion. For this purpose, the n-type Ge layer 4 and the Ge layer 16 are connected electrically by patterning the Al interconnection 21. FIG. 5I, FIG. 6I, and FIG. 7I show the structure of the completed photodiode. In this embodiment, structure in which the bipolar transistors are present on both sides putting the photoreceiving portion therebetween has been described, but the bipolar transistors may also be arranged only by one row to the photoreceiving portion on the side opposite to the incident direction of light. In this case, light absorption in the bipolar transistor portion can be prevented to improve the device characteristics. Further, while the bipolar transistor in this embodiment has a mesa type subjected to, emitter fabrication by wet etching, the bipolar forming step can be replaced with several bipolar fabrication processes such as self-alignment, etc. Further, while it has been described in this embodiment that the bipolar transistor is the npn type and the electrode layer buried in the photodiode is the p-type, the device can of course be manufactured also for the opposite conduction type. That is, it is possible to manufacture a pnp type bipolar transistor and the layer buried in the photodiode can be made as n-type. In this case, it is necessary to alter the emit fabrication process to a forming method such as the self-alignment process, etc. not using selective wet etching.

Second Embodiment

FIG. 8A to FIG. 8D are views for the cross sectional structure showing a second embodiment of a semiconductor photodiode according device to the invention along a photodiode device manufacturing steps. In FIG. 8A to FIG. 8D, portions having same functions as those in the first embodiment carry identical references with those in the first embodiment. The manufacturing steps are to be described sequentially.

At first, an insulating film 22 is deposited above an Si substrate 1, and patterning is applied to remove the insulating film 22 by etching while leaving a predetermined region. Further, an insulating film 23 is deposited and a trench is formed to the insulating film 22 to obtain a structure shown in FIG. 8A. It is preferred to use, for example, $Si_3N_4$ for the insulating film 22 and use, for example, $SiO_2$ for the insulating film 23. In this case, the $Si_3N_4$ film 22 may be fabricated by dry etching using sulfur hexafluoride ($SF_6$) and the $SiO_2$ film 23 may be fabricated by dry etching using the $Si_3N_4$ film 22 as a stopper by using an etching gas containing a fluorocompound.

Successively, the insulating film 22 is isotropically etched to the removed. In a case where the insulating film 22 is $Si_3N_4$, wet etching using phosphoric acid heated to 160° C. is suitable for etching and the insulating film 22 can be etched and recovered selectively to the insulating film 23 and the Si substrate 1. After etching, the insulating film 23 forms an overhang structure above the Si substrate 1. Then, a low temperature Ge buffer layer 3, a high concentration n-type Ge layer 4, and a high resistance Ge layer 6 are selectively grown continuously in the trench with the insulating film 23. In this case, growing is switched from the high concentration n-type Ge layer 4 to the high resistance Ge layer 6 just after the surface of the high concentration N-type Ge layer 4 is in contact with the overhang portion of the insulating film 23. That is, it is important that the thickness of the insulating film 22 is set to the thickness substantially identical with that of the aimed thickness of the high concentration n-type Ge layer 4. After epitaxial growing, a high concentration n-type region 7 is formed by ion implantation just below the emitter forming region of the bipolar portion to obtain a structure in FIG. 8B.

Then, in the same manner as in the first embodiment, a base layer 9 and a emitter layer 10 of the bipolar portion are fabricated to obtain a structure of FIG. 8C.

Then, a high concentration p-type Ge region 24 is formed by an ion implantation method to obtain a structure of FIG. 8D. The step of forming the high concentration p-type Ge region is a step of forming a region similar to the high concentration p-type Ge layer 13 formed by epitaxial growing in the existent example 1, and the impurity concentration and the pattern shape are as has been described above in the first embodiment.

Subsequently, a photodiode is completed by way of processes identical with those of the first embodiment. In this embodiment, while the structure after completion is substantially identical with that of the first embodiment, the number of epitaxial growing steps can be decreased upon manufacture of the structure of the photodiode. The epitaxial growing step in the first embodiment includes growing of the buffer layer 3 and the n-type semiconductor 4, growing of the high resistance Ge layer 6, growing of the emitter 10/base 9 of the bipolar portion, growing of the p-type Ge layer 13, and growing of the high resistance Ge layer 15 and the n-type Ge layer 16, and requires epitaxial growing steps five times in total up to completion. Since epitaxial growing is often carried out layer-by-layer, and a time of about several tens of minutes is necessary for one layer in the growing of Ge film of about 2 μm, the efficiency is poor. In this embodiment, the number of epitaxial growing steps is reduced to three thereby enabling to simplify the process and improve the throughput of the photodiode.

Third Embodiment

This embodiment discloses a photodiode device structure in which the capacitance of the bipolar portion in the photodiode device is decreased, and the manufacturing method thereof. FIG. 9A to FIG. 9I are cross sectional views showing the manufacturing process of the semiconductor photodiode device in this embodiment. Drawings show cross sections including the bipolar portion. While only one bipolar portion is shown in FIG. 9A to FIG. 9I for avoiding complexity, the bipolar portion may be present also in the opposite direction of the photoreceiving portion putting the portion therebetween.

At first, after depositing an insulating film 22 over an Si substrate 1 as shown in FIG. 9A, patterning is applied to leave the insulating film 22 while leaving only for the electrode fainting portions of the collector region in the bipolar portion and the n-type Ge layer in the photoreceiving portion and eliminating the remaining portions by etching. In the same manner as in the second embodiment, it is preferred to use an $Si_3N_4$ film for the insulating film 22 and dry etching is used preferably for etching fabrication. Then, an insulating film 23 is deposited over the entire surface. The insulating film 23 is preferably formed, for example, of an $SiO_2$ film.

Then, the insulating film 23 is opened in the photoreceiving portion and the bipolar portion respectively by anisotropic dry etching as shown in FIG. 9B. In this case, the surface of the insulating film 22 is partially exposed. The surface structure after the etching is shown in FIG. 10.

Successively, the insulating film 22 is isotropically removed by wet etching. In a case where the insulating film 22 is formed of $Si_3N_4$, etching is applied by wet etching using phosphoric acid heated to 160° C. Then, a low temperature buffer layer 3, an n-type Ge layer 4, and a high resistance Ge layer 6 are selectively grown continuously in the trench to obtain a structure of FIG. 9C. The cross section in the direction perpendicular to the direction of arranging the bipolar transistors is as shown in FIG. 11. In this case, growing is switched to that of the high resistance Ge layer 6 after the surface of the n-type Ge layer 4 is in contact with the overhang portion with the insulating film 23 as has been described for the second embodiment.

Then, after forming a high concentration n-type Ge region 7 by ion implantation only to the bipolar portion, the insulating film 23 is etched over the entire surface. Dry etching or wet etching is used for etching and it is applied till the side wall of the high resistance Ge layer 6 is exposed. The cross sectional structure after etching is as shown in FIG. 9D.

Then, an insulating film 25 is deposited, and the insulating film 25 is fabricated by patterning such that it covers the bipolar transistor forming region and the p-type Ge layer in the photoreceiving portion is in a comb shape. For example, an $SiO_2$ film may be used for the insulating film 25, and anisotropic dry etching is preferably used for the fabrication as described above. Then, a high concentration p-type Ge layer 13 in the photoreceiving portion is grown selectively to obtain a structure of FIG. 9E. In this case, growing in the direction parallel to the substrate is promoted by exposing the side wall of the high resistance Ge layer 6, and the photoreceiving portion and the bipolar portion are connected by the high concentration p-type Ge layer 13.

The insulating film 25 is removed and an insulating film 26 is additionally deposited. For example, an $SiO_2$ film may be used for the insulating film 26. Then, the insulating film 26 is fabricated so as to expose the bipolar portion. As described above, anisotropic dry etching is used preferably for fabrication. A base layer 9 comprising high concentration p-type Ge is grown selectively to obtain a structure shown in FIG. 9F. As shown in the drawing, the base layer 9 is in connection with the high concentration p-type Ge layer 13.

After depositing an insulating film 27 over the entire surface, an emitter forming region 28 is opened to obtain a structure shown in FIG. 9G. For example, An $SiO_2$ film may be used for the insulating film 27 and anisotropic dry etching is used for fabrication, so that the side wall of the trench is covered with the insulating film.

Emitter layers 10a, 10b comprising an n-type SiGe or n-type Si are formed in the emitter trench 28 by epitaxial growing. In this process, the emitter layer is formed by two step growing. The emitter layer 10b of the upper layer is at a high concentration ($1\times10^{20}$ cm$^{-3}$) and has a thickness of 50 to 100 nm in the same manner as in the existent example 1 and the impurity concentration of the emitter layer 10a as the lower layer is at a low concentration of $1\times10^{19}$ cm$^{-3}$ or less for preventing generation of a leak current due to emitter/base junction at high concentration and the thickness is defined from 5 to 20 nm. After forming the emitter layers 10a and 10b, an insulating film 14 is deposited over the entire surface and a photoreceiving portion forming region is opened by patterning. For example, an $SiO_2$ film may be used for the insulating film 14 and anisotropic dry etching may be used for fabrication. Then, high resistance Ge layer 15, and an n-type Ge layer 16 are epitaxially grown and an $Si_3N_4$ film 17 is formed to obtain a structure shown in FIG. 9H. The thickness and the impurity concentration of the high resistance layer 15 and the thickness of the insulating film 14 areas shown in the existent example 1.

Finally, an insulating film 18 is deposited and planarized and a metal electrodes are formed to obtain a final structure shown in FIG. 9I. FIG. 12 shows a planar structure corresponding to FIG. 9I.

This embodiment has a feature capable of decreasing the inter collector/base capacitance of the bipolar transistor by insulating separation between the collector of the bipolar transistor and the n-type Ge layer 4 of the photoreceiving portion. Decrease of the inter collector/base capacitance greatly contributes to the improvement of high speed performance of the bipolar transistor in a low current region. FIG. 13 shows the effect. FIG. 13 shows the high frequency characteristic in comparison between a case with insulating separation and with no insulating separation of the collector of the bipolar transistor and the n-type Ge layer 4 of the photoreceiving portion. FIG. 13 shows the dependence of the cutoff frequency on the collector current density as an index of the high speed operation. In a case of insulating separation, the inter collector/base capacitance is decreased to ⅓ or less compared with the case without insulating separation and, correspondingly, the cutoff frequency in a low current density is improved. The drawing shows the high frequency characteristics in a case of applying a forward voltage between the base and the emitter. Since the bipolar phototransistor in the photodiode device is operated at a base/emitter voltage of 0 V, the operation current is extremely small. Since the cutoff frequency is also low in a region of a small operation current, the bipolar phototransistor cannot provide sufficient high speed operation performance. In this embodiment, the cutoff frequency at low current is increased by the decrease of the inter collector/base capacitance and signals at high frequency applied from the photoreceiving portion can be amplified. Further, in this embodiment, inter emitter/base capacitance can also be decreased by defining the impurity concentration to $1\times10^{18}$ cm$^{-3}$ and the thickness to about 15 nm for the emitter layer 10a and the cutoff frequency can be improved further at a low current. In this embodiment, similar effect can be obtained also by using opposite conduction type for each of the layers in the same manner as in the first embodiment. Further, for forming the bipolar transistor, it may be formed by using an emitter trench as in this embodiment, growing emitter/base continuously into a mesa structure as in the first embodiment, or applying the self alignment structure.

Fourth Embodiment

This embodiment discloses a photodiode device structure in which a bipolar portion is independent of the photoreceiving portion and a manufacturing method thereof. FIG. 14A to FIG. 14D, and FIG. 15A to FIG. 15D are cross sectional views showing the manufacturing process of a semiconductor photodiode device in this embodiment. FIG. 14A to FIG. 14D are cross sectional views including a bipolar portion and FIG. 15A to FIG. 15D show cross sections of the photoreceiving portion in a direction perpendicular to the cross section including the bipolar portion.

In this embodiment, description for the steps identical with those in the first embodiment to the third embodiment are omitted and the feature for the structure and the manufacturing steps inherent to this embodiment are to be described.

FIG. 14A and FIG. 15A are cross sectional views after selective growing of the high concentration p-type Ge layer 13 described in FIG. 9E of the third embodiment. However, this embodiment has a feature different from the third embodiment with respect to the following two points. At first, the thickness of the high resistance Ge layer 6 is made thin. This embodiment is designed conforming to the width of the depletion layer between the collector and the base of a bipolar transistor necessary for high speed operation and has a thickness of 100 to 150 nm. As the thickness of the high resistance Ge layer 6 is decreased, the ion implantation step just below the bipolar transistor is omitted. The second feature of this embodiment is that the high concentration p-type Ge layer 13 is not divided but formed over the entire surface of the photoreceiving portion. The high concentration p-type Ge layer 13 is utilized as a lowermost layer for sandwiching the light absorption layer.

FIG. 14B and FIG. 15B are cross sectional views after selective growing of a high resistance Ge layer 15 and a high concentration n-type Ge layer 16 in the trench of the photoreceiving portion. In this case, the high concentration n-type Ge layer 16 is selectively grown to a comb type pattern. That is, after forming the high resistance Ge layer 15, an insulating film 29 is deposited and patterned and then the high concentration n-type Ge layer 16 is grown selectively. The high concentration n-type, Ge layer 16 in this embodiment has the same role as the high concentration p-type Ge layer 13 in the first embodiment and has a role as an electrode to be buried inside the light absorption layer. Accordingly, the distance between the patterns and the width and the height of the n-type Ge layer 16 are formed with the features as described for the existent example 1. Then, a high resistance Ge layer 31 and a high concentration n-type Ge layer 32 as layers above the light absorption layer are formed within a trench of a photoreceiving portion forming region formed with the insulating film 32, and an $Si_3N_4$ film 17 is formed further above the high concentration n-type Ge layer 32 to obtain a structure shown in FIG. 14C and FIG. 15C. In this case, the thickness and the impurity concentration of the high resistance Ge layer 31 are determined depending on the type of the photodiode and the light penetration length of Ge as has been described in the first embodiment.

Finally, an insulating film 18 and metal electrodes 19 to 21 are formed to obtain a complete structure shown in FIG. 14D and FIG. 15D. FIG. 16 shows a planar structure of a photodiode disclosed in this embodiment.

In this embodiment, since the bipolar transistor portion is formed separately from the photoreceiving portion like in the third embodiment, it is possible to decrease the inter collector/base capacitance and increase the operation speed of the transistor corresponding thereto. In addition, this embodiment has a structure in which the electrode of the bipolar transistor electrically connected with the photoreceiving portion is only the base and the collector portion is completely separated from the photodiode. This feature provides an advantage capable of realizing low noise characteristic. This is due to the following reason. The Ge photodiode formed above Si contains defects in the inside for moderating strain energy generated due to the difference of lattice constant present between Si and Ge in the crystal growing process. The Ge photodiode disclosed in this invention realizes improvement for the crystallinity of the Ge layer due to the use of the buffer layer 3 upon crystal growth of Ge but defects are still present at a density of about $1 \times 10^7$ cm$^{-3}$ in the Ge photodiode. Defects in the photodiode generate electron-hole pairs when a backward bias is applied to the p/n junction to generate a current noise referred to as a dark current also in a case where optical signals are not incident. In the structure shown in the first embodiment, holes generated from the defects flow from the high concentration p-type Ge layer 13 to the base of the bipolar transistor, while electrons flow from the high concentration n-type Ge layer 4 to the collector of the bipolar transistor to form current noises. In this embodiment, since the high concentration n-type Ge layer 16 is separated from the collector, a dark current flowing into the collector can be interrupted. Accordingly, noises can be decreased further compared with those in the first embodiment. However, in this embodiment, since high frequency signals flowing into the base are formed by holes flowing to the high concentration p-type Ge layer 13 as a lower layer for the light absorption layer, when the thickness of the high concentration Ge layer 15 is large in the surface photoreceiving type device, carrier running time increases to deteriorate the high frequency characteristics of the photodiode. Therefore, in a case of the surface photoreceiving type device, it is necessary to set the thickness of the high concentration Ge layer 15 such that the total thickness of the light absorption layer is identical with or less than the light absorption of Ge. In this embodiment, same effects can be obtained also by the use of opposite conduction type for each of the layers in the same manner as in first embodiment. Further, as the method for forming the bipolar transistor, it may be formed by using an emitter trench as in this embodiment, growing emitter/base continuously into a mesa shape as in the first embodiment, or applying a self alignment structure.

Fifth Embodiment

This embodiment discloses a photodiode capable of decreasing a parasitic resistance in a surface photoreceiving type device, as well as a manufacturing method thereof.

FIG. 17A and FIG. 17B are plan views showing the manufacturing process of a semiconductor photodiode device in this embodiment. FIG. 17A is a view showing the surface of a photodiode device in the step identical with the step after selective growing of the high concentration p-type Ge layer 13 shown in FIG. 5F, FIG. 6F, and FIG. 7F of the first embodiment. Further, FIG. 17B is a view showing the surface of a photodiode device in the step of removing an insulating film 8 by etching after selective growing of the high concentration p-type Ge layer 13. This embodiment has a feature in that the high concentration p-type Ge layer 13 buried in the photoreceiving portion has a lattice-shape. In a case of the stripe shape Ge layer 13 as shown in FIG. 7F, the resistance of the Ge layer 13 increases when the width of the Ge layer 13 is decreased for decreasing the capacitance. Since the time constant represented by the product of the resistance and the capacitance of the photodiode gives an effect on the high speed operation characteristic, even when the width of the Ge layer 13 is decreased to lower the capacitance, if it results in remarkable increase in the resistance of the Ge layer 13, the high speed operation characteristic is rather deteriorated. In this embodiment, the current path is increased by applying lattice-like patterning and it is possible to suppress the increase of the resistance even when the width of the Ge layer 13 is decreased.

In this embodiment, only the pattern of the high concentration p-type Ge layer 13 of the photodiode is changed, which can be combined with all embodiments from the first embodiment to the fourth embodiment. Further, FIG. 17A and FIG. 17B show examples in which arranged rows of bipolar transistors are arranged in four directions of a photodiode. They are arranged so that current can be amplified more efficiently but there is no restriction for the arrangement of the transistor rows and they may be disposed only on both sides of the photodiode as shown in the existent example 1.

Sixth Embodiment

This embodiment discloses a photodiode device capable of realizing a low parasitic resistance and a low parasitic capacitance in a surface photoreceiving type device and a manufacturing method thereof.

FIG. 18A and FIG. 18B are plan views showing the manufacturing process of a semiconductor photodiode device in this embodiment. FIG. 18A is a view showing the surface of the photodiode device in the step identical with that after selective growing of the high concentration p-type Ge layer 13 shown in FIG. 5F, FIG. 6F, and FIG. 7F of the first embodiment. Further, FIG. 18B is a view showing the surface of the photodiode device in the step of removing the insulating film 8 by etching after selective growing of the high concentration p-type Ge layer 13. This embodiment has a feature in that a high concentration p-type Ge layer 13 buried in the photoreceiving portion has a special shape shown in FIG. 18A. In the lattice-like pattern shown in the fifth embodiment, while the resistance can be decreased, the p/n junction area is increased more compared with the case of the stripe shape. Therefore, it is necessary to provide further improvement to the pattern structure in order to realize a photodiode device of low capacitance and low resistance. In the pattern shape shown in FIG. 18, the current path can be made substantially identical with that of the fifth embodiment, as well as the p/n junction area can be decreased. Accordingly, low resistance property and high capacitance property can be attained.

In this embodiment, only the pattern of the high concentration p-type Ge layer 13 of the photodiode is changed, which can be combined with all embodiments from the first embodiment to the fourth embodiment. Further, FIG. 18A and FIG. 18B show examples in which arranged rows of bipolar transistors are disposed in four directions of the photodiodes. They are arranged so that current can be amplified more efficiently but there is no restriction on the arrangement of the transistor rows and they may be disposed only on both sides of the photodiode as shown in the existent example 1.

Seventh Embodiment

This embodiment discloses a photodiode diode capable of decreasing the parasitic resistance in a waveguide type photodiode, as well as a manufacturing method thereof. FIG. 19 to FIG. 21 are a plan view and cross sectional views showing the semiconductor photodiode device in this embodiment. FIG. 20 is a cross sectional view along line a in FIG. 19 and FIG. 21 is a cross sectional view along line b in FIG. 19.

The plan view of the photodiode device shown in FIG. 19 shows a feature that a comb pattern of the high concentration p-type Ge layer 13 has a pattern shape rotated by 90° relative to an incident light and a bipolar transistor portion 9. While each of photodiode devices disclosed in the first embodiment to the fourth embodiment has a structure where the longer side of the comb pattern is opposed perpendicular to the bipolar transistor, the resistance of the high concentration p-type Ge layer 13 increases remarkably in the waveguide type structure since it is necessary that the distance in the direction of the photoreceiving portion of the longer side has to be made longer to about 100 μm depending on the case. On the contrary, in the structure disclosed in this embodiment, the current path of the high concentration Ge layer 13 is shortened thereby enabling to decrease the resistance. Accordingly, a photodiode device of more excellent high speed performance can be attained.

In this embodiment, only one row of the arranged bipolar transistors is disposed relative to the photoreceiving portion on the side opposite to the incident light. This arrangement is in accordance with a purpose of avoiding the absorption of light by the bipolar transistors and increasing the photoreceiving efficiency but there is no restriction for the arrangement of the transistor rows and they may be arranged only on both sides of the photodiode as shown in the existent example 1.

What is claimed is:

1. A semiconductor photodiode device comprising:
a semiconductor substrate;
a first conduction type first semiconductor layer formed above the semiconductor substrate;
a high resistance second semiconductor layer formed above the first semiconductor layer;
a first conduction type third semiconductor layer formed above the second semiconductor layer; and
a second conduction type fourth semiconductor layer buried in the second semiconductor layer,
wherein the fourth semiconductor layer has a plurality of parts, each of the parts being spaced from at least one other adjacent part of said plurality by a predetermined distance in a direction parallel to an upper surface of the semiconductor substrate.

2. The semiconductor photodiode device according to claim 1, wherein the fourth semiconductor layer has a band-like stripe structure or a lattice-like periodical structure.

3. The semiconductor photodiode device of a surface photoreceiving type according to claim 2, wherein said predetermined distance is one-half or less of a penetration length of light having a predetermined wavelength for optical communication.

4. The semiconductor photodiode device according to claim 3, comprises a transistor having a current amplification function.

5. The semiconductor photodiode device according to claim 4,
wherein the transistor is a bipolar transistor,
wherein the semiconductor substrate comprises silicon,
wherein each of the first to the fourth semiconductor layers comprises single-crystal germanium or single-crystal silicon-germanium, and
wherein an emitter of the bipolar transistor comprises single-crystal silicon-germanium or single-crystal silicon.

6. The semiconductor photodiode device according to claim 5, wherein the fourth semiconductor layer serves as a base of the bipolar transistor.

7. The semiconductor photodiode device according to claim 5, wherein the first semiconductor layer serves as a base of the bipolar transistor.

8. The semiconductor photodiode device according to claim 2, wherein said predetermined distance is one-half or less of a thickness of the second semiconductor layer.

9. A semiconductor photodiode device according to claim 8, comprising a transistor having a current amplification function.

10. The semiconductor photodiode device according to claim 9,
wherein the transistor is a bipolar transistor,
wherein the semiconductor substrate comprises silicon,
wherein each of the first to the fourth semiconductor layers comprises single-crystal germanium or single-crystal silicon-germanium, and
wherein an emitter of the bipolar transistor comprises single-crystal silicon-germanium or single-crystal silicon.

11. The semiconductor photodiode device according to claim 10, wherein the fourth semiconductor layer serves as a base of the bipolar transistor.

12. The semiconductor photodiode device according to claim 10, wherein the first semiconductor layer serves as a base of the bipolar transistor.

\* \* \* \* \*